(12) United States Patent
Brodsky et al.

(10) Patent No.: US 10,378,925 B2
(45) Date of Patent: *Aug. 13, 2019

(54) CIRCUIT BOARDS AND ELECTRONIC PACKAGES WITH EMBEDDED TAMPER-RESPONDENT SENSOR

(71) Applicant: INTERNATIONAL BUSINESS MACHINES CORPORATION, Armonk, NY (US)

(72) Inventors: William L. Brodsky, Binghamtom, NY (US); Silvio Dragone, Olten (CH); Roger S. Krabbenhoft, Rochester, MN (US); David C. Long, Wappingers Falls, NY (US); Stefano S. Oggioni, Milan (IT); Michael T. Peets, Staatsburg, NY (US); William Santiago-Fernandez, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/162,679

(22) Filed: Oct. 17, 2018

(65) Prior Publication Data
US 2019/0049269 A1    Feb. 14, 2019

Related U.S. Application Data

(63) Continuation of application No. 14/941,908, filed on Nov. 16, 2015, which is a continuation of application No. 14/865,610, filed on Sep. 25, 2015.

(51) Int. Cl.
*H05K 1/02*    (2006.01)
*G01D 5/16*    (2006.01)
(Continued)

(52) U.S. Cl.
CPC ............ *G01D 5/16* (2013.01); *H05K 1/0275* (2013.01); *H05K 1/0298* (2013.01); *H05K 1/182* (2013.01);
(Continued)

(58) Field of Classification Search
CPC .......................... H05K 1/0275; H05K 1/0298
See application file for complete search history.

(56) References Cited

U.S. PATENT DOCUMENTS

| 3,165,569 | A | 1/1965 | Bright et al. |
| 4,097,894 | A | 6/1978 | Tanner et al. |

(Continued)

FOREIGN PATENT DOCUMENTS

| CN | 2014-30639 Y | 3/2010 |
| CN | 10-4346587 A | 2/2015 |

(Continued)

OTHER PUBLICATIONS

Holm, Ragnar, "Electric Contacts: Theory and Application", Spinger-Verlag, New York, 4th Edition, 1981 (pp. 10-19).
(Continued)

*Primary Examiner* — Minh Q Phan
(74) *Attorney, Agent, or Firm* — Tihon Poltavets, Esq.; Kevin P. Radigan, Esq.; Heslin Rothenberg Farley & Mesiti P.C.

(57) ABSTRACT

Electronic circuits, electronic packages, and methods of fabrication are provided. The electronic circuit includes a multilayer circuit board, and a tamper-respondent sensor embedded within the circuit board. The tamper-respondent sensor defines, at least in part, a secure volume associated with the multilayer circuit board. In certain implementations, the tamper-respondent sensor includes multiple tamper-respondent layers embedded within the circuit board including, for instance, one or more tamper-respondent
(Continued)

frames and one or more tamper-respondent mat layers, with the tamper-respondent frame(s) being disposed, at least in part, above the tamper-respondent mat layer(s), which together define the secure volume where extending into the multilayer circuit board. In certain embodiments, one or more of the tamper-respondent layers are divided into multiple, separate tamper-respondent circuit zones, with the tamper-respondent layers, including the circuit zones, being electrically connected to monitor circuitry within the secure volume.

9 Claims, 17 Drawing Sheets

(51) Int. Cl.
    *H05K 1/18*     (2006.01)
    *H05K 3/30*     (2006.01)
    *H05K 3/32*     (2006.01)

(52) U.S. Cl.
    CPC ............... *H05K 3/30* (2013.01); *H05K 3/32* (2013.01); *H05K 2201/096* (2013.01); *H05K 2201/09263* (2013.01); *H05K 2201/10151* (2013.01); *H05K 2201/10371* (2013.01)

(56) References Cited

U.S. PATENT DOCUMENTS

| | | |
|---|---|---|
| 4,160,503 A | 7/1979 | Ohlbach |
| 4,211,324 A | 7/1980 | Ohlbach |
| 4,324,823 A | 4/1982 | Ray, III |
| 4,450,504 A | 5/1984 | Severson |
| 4,496,900 A | 1/1985 | Di Stefano et al. |
| 4,516,679 A | 5/1985 | Simpson |
| 4,542,337 A | 9/1985 | Rausch |
| 4,593,384 A | 6/1986 | Kleinjne |
| 4,609,104 A | 9/1986 | Kasper et al. |
| 4,653,252 A | 3/1987 | Van de Haar et al. |
| 4,677,809 A | 7/1987 | Long et al. |
| 4,691,350 A | 9/1987 | Kleijne et al. |
| 4,807,284 A | 2/1989 | Kleijne |
| 4,811,288 A | 3/1989 | Kleijne et al. |
| 4,847,139 A | 7/1989 | Wolf et al. |
| 4,860,351 A | 8/1989 | Weingart |
| 4,865,197 A | 9/1989 | Craig |
| 5,009,311 A | 4/1991 | Schenk |
| 5,027,397 A | 6/1991 | Double et al. |
| 5,060,114 A | 10/1991 | Feinberg et al. |
| 5,075,822 A | 12/1991 | Baumler et al. |
| 5,117,457 A | 5/1992 | Comerford et al. |
| 5,159,629 A | 10/1992 | Double et al. |
| 5,185,717 A | 2/1993 | Mori |
| 5,201,868 A | 4/1993 | Johnson |
| 5,201,879 A | 4/1993 | Steele et al. |
| 5,211,618 A | 5/1993 | Stoltz |
| 5,239,664 A | 8/1993 | Verrier et al. |
| 5,243,162 A | 9/1993 | Kobayashi |
| 5,389,738 A | 2/1995 | Piosenka et al. |
| 5,406,630 A | 4/1995 | Piosenka et al. |
| 5,458,912 A | 10/1995 | Camilletti et al. |
| 5,506,566 A | 4/1996 | Oldfield et al. |
| 5,568,124 A | 10/1996 | Joyce et al. |
| 5,594,439 A | 1/1997 | Swanson |
| 5,675,319 A | 10/1997 | Rivenberg et al. |
| 5,715,652 A | 2/1998 | Stahlecker |
| 5,761,054 A | 6/1998 | Kuhn |
| 5,813,113 A | 9/1998 | Stewart et al. |
| 5,858,500 A | 1/1999 | MacPherson |
| 5,880,523 A | 3/1999 | Candelore |
| 5,975,420 A | 11/1999 | Gogami et al. |
| 5,988,510 A | 11/1999 | Tuttle et al. |
| 6,121,544 A | 9/2000 | Petsinger |
| 6,195,267 B1 | 2/2001 | MacDonald, Jr. et al. |
| 6,201,296 B1 | 3/2001 | Fries et al. |
| 6,233,339 B1 | 5/2001 | Kawano et al. |
| 6,259,363 B1 | 7/2001 | Payne |
| 6,261,215 B1 | 7/2001 | Imer |
| 6,301,096 B1 | 10/2001 | Wozniczka |
| 6,355,316 B1 | 3/2002 | Miller et al. |
| 6,384,397 B1 | 5/2002 | Takiar et al. |
| 6,396,400 B1 | 5/2002 | Epstein, III et al. |
| 6,420,971 B1 | 7/2002 | Leck et al. |
| 6,424,954 B1 | 7/2002 | Leon |
| 6,438,825 B1 | 8/2002 | Kuhm |
| 6,469,625 B1 | 10/2002 | Tomooka |
| 6,473,995 B2 | 11/2002 | Miyakawa et al. |
| 6,512,454 B2 | 1/2003 | Miglioli et al. |
| 6,686,539 B2 | 2/2004 | Farquhar et al. |
| 6,746,960 B2 | 6/2004 | Goodman et al. |
| 6,798,660 B2 | 9/2004 | Moss et al. |
| 6,817,204 B2 | 11/2004 | Bash et al. |
| 6,853,093 B2 * | 2/2005 | Cohen .................. H01L 23/576 257/678 |
| 6,879,032 B2 | 4/2005 | Rosenau et al. |
| 6,895,509 B1 | 5/2005 | Clark |
| 6,929,900 B2 | 8/2005 | Farquhar et al. |
| 6,946,960 B2 | 9/2005 | Sisson et al. |
| 6,957,345 B2 | 10/2005 | Cesana et al. |
| 6,970,360 B2 | 11/2005 | Sinha |
| 6,982,642 B1 | 1/2006 | Cesana et al. |
| 6,985,362 B2 | 1/2006 | Mori et al. |
| 6,991,961 B2 | 1/2006 | Hubbard et al. |
| 6,996,953 B2 | 2/2006 | Perreault et al. |
| 7,005,733 B2 | 2/2006 | Kommerling et al. |
| 7,007,171 B1 | 2/2006 | Butturini et al. |
| 7,015,823 B1 | 3/2006 | Gillen et al. |
| 7,054,162 B2 | 5/2006 | Benson et al. |
| 7,057,896 B2 | 6/2006 | Matsuo et al. |
| 7,094,143 B2 | 8/2006 | Wolm et al. |
| 7,094,459 B2 | 8/2006 | Takahashi |
| 7,095,615 B2 | 8/2006 | Nichols |
| 7,156,233 B2 | 1/2007 | Clark et al. |
| 7,180,008 B2 | 2/2007 | Heitmann et al. |
| 7,189,360 B1 | 3/2007 | Ho et al. |
| 7,214,874 B2 | 5/2007 | Dangler et al. |
| 7,247,791 B2 | 7/2007 | Kulpa |
| 7,304,373 B2 | 12/2007 | Taggart et al. |
| 7,310,737 B2 | 12/2007 | Patel et al. |
| 7,465,887 B2 | 12/2008 | Suzuki et al. |
| 7,475,474 B2 | 1/2009 | Heitmann et al. |
| 7,515,418 B2 | 4/2009 | Straznicky et al. |
| 7,549,064 B2 | 6/2009 | Elbert et al. |
| 7,640,658 B1 | 1/2010 | Pham et al. |
| 7,643,290 B1 | 1/2010 | Narasimhan et al. |
| 7,663,883 B2 | 2/2010 | Shirakami et al. |
| 7,671,324 B2 | 3/2010 | Fleischman et al. |
| 7,672,129 B1 | 3/2010 | Ouyang et al. |
| 7,731,517 B2 | 6/2010 | Lee et al. |
| 7,746,657 B2 | 6/2010 | Oprea et al. |
| 7,760,086 B2 | 7/2010 | Hunter et al. |
| 7,768,005 B2 | 8/2010 | Condorelli et al. |
| 7,783,994 B2 | 8/2010 | Ball et al. |
| 7,787,256 B2 | 8/2010 | Chan et al. |
| 7,868,411 B2 | 1/2011 | Eaton et al. |
| 7,898,413 B2 | 3/2011 | Hsu et al. |
| 7,901,977 B1 | 3/2011 | Angelopoulos et al. |
| 7,947,911 B1 | 5/2011 | Pham et al. |
| 7,978,070 B2 | 7/2011 | Hunter |
| 8,006,101 B2 | 8/2011 | Crawford |
| 8,084,855 B2 | 12/2011 | Lower et al. |
| 8,094,450 B2 | 1/2012 | Cole et al. |
| 8,101,267 B2 | 1/2012 | Samuels et al. |
| 8,133,621 B2 | 3/2012 | Wormald et al. |
| 8,199,506 B2 | 6/2012 | Janik et al. |
| 8,287,336 B2 | 10/2012 | Dangler et al. |
| 8,325,486 B2 | 12/2012 | Arshad et al. |
| 8,345,423 B2 | 1/2013 | Campbell et al. |
| 8,393,918 B2 | 3/2013 | Cheng et al. |
| 8,516,269 B1 | 8/2013 | Hamlet et al. |
| 8,589,703 B2 | 11/2013 | Lee et al. |
| 8,646,108 B2 | 2/2014 | Shiakallis et al. |
| 8,659,506 B2 | 2/2014 | Nomizo |

(56) References Cited

U.S. PATENT DOCUMENTS

| | | |
|---|---|---|
| 8,659,908 B2 | 2/2014 | Adams et al. |
| 8,664,047 B2 | 3/2014 | Lower et al. |
| 8,716,606 B2 | 5/2014 | Kelley et al. |
| 8,797,059 B2 | 8/2014 | Boday et al. |
| 8,836,509 B2 | 9/2014 | Lowy |
| 8,853,839 B2 | 10/2014 | Gao et al. |
| 8,879,266 B2 | 11/2014 | Jarvis et al. |
| 8,890,298 B2 | 11/2014 | Buer et al. |
| 8,947,889 B2 | 2/2015 | Kelley et al. |
| 8,961,280 B2 | 2/2015 | Dangler et al. |
| 9,003,199 B2 | 4/2015 | Dellmo et al. |
| 9,011,762 B2 | 4/2015 | Seppa et al. |
| 9,052,070 B2 | 6/2015 | Davis et al. |
| 9,166,586 B2 | 10/2015 | Carapelli et al. |
| 9,298,956 B2 | 3/2016 | Wade et al. |
| 9,554,477 B1 | 1/2017 | Brodsky et al. |
| 9,555,606 B1 | 1/2017 | Fisher et al. |
| 9,560,737 B2 | 1/2017 | Issacs et al. |
| 9,578,735 B2 | 2/2017 | Fisher et al. |
| 9,578,764 B1 | 2/2017 | Fisher et al. |
| 9,586,857 B2 | 3/2017 | Cabral, Jr. et al. |
| 9,591,776 B1 | 3/2017 | Brodsky et al. |
| 9,661,747 B1 | 5/2017 | Brodsky et al. |
| 9,681,649 B2 | 6/2017 | Busby et al. |
| 9,717,154 B2 | 7/2017 | Brodsky et al. |
| 9,858,776 B1 | 1/2018 | Busby et al. |
| 9,877,383 B2 | 1/2018 | Brodsky et al. |
| 9,881,880 B2 | 1/2018 | Busby et al. |
| 9,894,749 B2 | 2/2018 | Brodsky et al. |
| 9,904,811 B2 | 2/2018 | Campbell et al. |
| 9,911,012 B2 | 3/2018 | Brodsky et al. |
| 9,913,362 B2 | 3/2018 | Brodsky et al. |
| 9,913,370 B2 | 3/2018 | Busby et al. |
| 9,913,416 B2 | 3/2018 | Fisher et al. |
| 9,916,744 B2 | 3/2018 | Busby et al. |
| 9,924,591 B2 | 3/2018 | Brodsky et al. |
| 9,930,768 B2 | 3/2018 | Fisher et al. |
| 9,936,573 B2 | 4/2018 | Brodsky et al. |
| 9,949,357 B2 | 4/2018 | Fisher et al. |
| 9,978,231 B2 | 5/2018 | Isaacs |
| 9,999,124 B2 | 6/2018 | Busby et al. |
| 2001/0049021 A1 | 12/2001 | Valimont |
| 2001/0050425 A1 | 12/2001 | Beroz et al. |
| 2001/0056542 A1 | 12/2001 | Cesana et al. |
| 2002/0002683 A1 | 1/2002 | Benson |
| 2002/0068384 A1 | 6/2002 | Beroz et al. |
| 2002/0084090 A1 | 7/2002 | Farquhar |
| 2003/0009683 A1 | 1/2003 | Schwenck et al. |
| 2003/0009684 A1 | 1/2003 | Schwenck et al. |
| 2003/0198022 A1 | 10/2003 | Ye et al. |
| 2004/0218366 A1 | 11/2004 | Speigl |
| 2005/0068735 A1 | 3/2005 | Fissore et al. |
| 2005/0111194 A1 | 5/2005 | Sohn et al. |
| 2005/0161253 A1 | 7/2005 | Heitmann et al. |
| 2005/0180104 A1 | 8/2005 | Olesen et al. |
| 2006/0034731 A1 | 2/2006 | Lewis et al. |
| 2006/0049941 A1 | 3/2006 | Hunter et al. |
| 2006/0072288 A1 | 4/2006 | Stewart et al. |
| 2006/0080348 A1 | 4/2006 | Cesana et al. |
| 2006/0196945 A1 | 9/2006 | Mendels |
| 2006/0218779 A1 | 10/2006 | Ooba et al. |
| 2007/0038865 A1 | 2/2007 | Oggioni et al. |
| 2007/0064396 A1 | 3/2007 | Oman et al. |
| 2007/0064399 A1 | 3/2007 | Mandel et al. |
| 2007/0108619 A1 | 5/2007 | Hsu |
| 2007/0125867 A1 | 6/2007 | Oberle |
| 2007/0211436 A1 | 9/2007 | Robinson et al. |
| 2007/0223165 A1 | 9/2007 | Itri et al. |
| 2007/0230127 A1 | 10/2007 | Peugh et al. |
| 2007/0268671 A1 | 11/2007 | Brandenburg et al. |
| 2007/0271544 A1 | 11/2007 | Engstrom |
| 2008/0036598 A1 | 2/2008 | Oggioni |
| 2008/0050512 A1 | 2/2008 | Lower et al. |
| 2008/0061972 A1 | 3/2008 | Hwang et al. |
| 2008/0086876 A1 | 4/2008 | Douglas |
| 2008/0128897 A1 | 6/2008 | Chao |
| 2008/0144290 A1 | 6/2008 | Brandt et al. |
| 2008/0159539 A1 | 7/2008 | Huang et al. |
| 2008/0160274 A1 | 7/2008 | Dang et al. |
| 2008/0191174 A1 | 8/2008 | Ehrensvard et al. |
| 2008/0251906 A1* | 10/2008 | Eaton .................. H01L 23/576 257/686 |
| 2008/0278353 A1 | 11/2008 | Smith et al. |
| 2009/0031135 A1 | 1/2009 | Kothandaraman |
| 2009/0073659 A1 | 3/2009 | Peng et al. |
| 2009/0152339 A1 | 6/2009 | Hawkins et al. |
| 2009/0166065 A1 | 7/2009 | Clayton et al. |
| 2009/0212945 A1 | 8/2009 | Steen |
| 2010/0088528 A1 | 4/2010 | Sion |
| 2010/0110647 A1 | 5/2010 | Hiew et al. |
| 2010/0134959 A1 | 6/2010 | Fife et al. |
| 2010/0177487 A1 | 7/2010 | Arshad et al. |
| 2010/0319986 A1 | 12/2010 | Bleau et al. |
| 2011/0001237 A1 | 1/2011 | Brun et al. |
| 2011/0038123 A1 | 2/2011 | Janik et al. |
| 2011/0103027 A1 | 5/2011 | Aoki et al. |
| 2011/0241446 A1 | 10/2011 | Tucholski |
| 2011/0299244 A1 | 12/2011 | Dede et al. |
| 2012/0047374 A1 | 2/2012 | Klum et al. |
| 2012/0050998 A1 | 3/2012 | Klum et al. |
| 2012/0052252 A1 | 3/2012 | Kohli et al. |
| 2012/0068846 A1 | 3/2012 | Dalzell et al. |
| 2012/0117666 A1 | 5/2012 | Oggioni et al. |
| 2012/0140421 A1 | 6/2012 | Kirstine et al. |
| 2012/0319986 A1 | 6/2012 | Toh et al. |
| 2012/0170217 A1 | 7/2012 | Nishikimi et al. |
| 2012/0185636 A1 | 7/2012 | Leon et al. |
| 2012/0244742 A1 | 9/2012 | Wertz et al. |
| 2012/0256305 A1 | 10/2012 | Kaufmann et al. |
| 2012/0320529 A1 | 12/2012 | Loong et al. |
| 2013/0021758 A1 | 1/2013 | Bernstein et al. |
| 2013/0033818 A1 | 2/2013 | Hosoda et al. |
| 2013/0058052 A1 | 3/2013 | Arshad et al. |
| 2013/0104252 A1 | 4/2013 | Yanamadala et al. |
| 2013/0141137 A1 | 6/2013 | Krutzik et al. |
| 2013/0154834 A1 | 6/2013 | Busca et al. |
| 2013/0158936 A1 | 6/2013 | Rich et al. |
| 2013/0208422 A1 | 8/2013 | Hughes et al. |
| 2013/0235527 A1 | 9/2013 | Wagner et al. |
| 2013/0283386 A1 | 10/2013 | Lee |
| 2014/0022733 A1 | 1/2014 | Lim et al. |
| 2014/0027159 A1 | 1/2014 | Salle et al. |
| 2014/0028335 A1 | 1/2014 | Salle et al. |
| 2014/0033331 A1 | 1/2014 | Salle et al. |
| 2014/0160679 A1 | 6/2014 | Kelty et al. |
| 2014/0184263 A1 | 7/2014 | Ehrenpfordt et al. |
| 2014/0204533 A1 | 7/2014 | Abeyasekera et al. |
| 2014/0206800 A1 | 7/2014 | Wu et al. |
| 2014/0233165 A1 | 8/2014 | Farkas et al. |
| 2014/0296410 A1 | 10/2014 | Cheng et al. |
| 2014/0306014 A1 | 10/2014 | Salle et al. |
| 2014/0321064 A1 | 10/2014 | Bose et al. |
| 2014/0325688 A1* | 10/2014 | Cashin .................. G06F 21/86 726/34 |
| 2015/0007427 A1 | 1/2015 | Dangler et al. |
| 2015/0120072 A1 | 4/2015 | Marom et al. |
| 2015/0143551 A1 | 5/2015 | Tiemeijer |
| 2015/0163933 A1 | 6/2015 | Steiner |
| 2015/0213243 A1 | 7/2015 | Hughes et al. |
| 2015/0235053 A1 | 8/2015 | Lee et al. |
| 2015/0244374 A1 | 8/2015 | Hadley |
| 2015/0307250 A1 | 10/2015 | Sokol |
| 2016/0005262 A1 | 1/2016 | Hirato et al. |
| 2016/0012693 A1 | 1/2016 | Sugar |
| 2016/0262270 A1 | 9/2016 | Isaacs et al. |
| 2017/0006712 A1 | 1/2017 | Matsushima et al. |
| 2017/0019987 A1 | 3/2017 | Dragone et al. |
| 2017/0068881 A1 | 3/2017 | Camper et al. |
| 2017/0089729 A1 | 3/2017 | Brodsky et al. |
| 2017/0089977 A1 | 3/2017 | Warnock et al. |
| 2017/0091491 A1 | 3/2017 | Dangler et al. |
| 2017/0094783 A1 | 3/2017 | Dangler et al. |
| 2017/0094803 A1 | 3/2017 | Dangler et al. |
| 2017/0094804 A1 | 3/2017 | Brodsky et al. |

(56) References Cited

U.S. PATENT DOCUMENTS

| | | |
|---|---|---|
| 2017/0094805 A1 | 3/2017 | Dangler et al. |
| 2017/0094808 A1 | 3/2017 | Brodsky et al. |
| 2017/0103683 A1 | 4/2017 | Yazdi et al. |
| 2017/0108543 A1 | 4/2017 | Brodsky et al. |
| 2017/0111998 A1 | 4/2017 | Brodsky et al. |
| 2017/0156223 A1 | 6/2017 | Fisher et al. |
| 2017/0171999 A1 | 6/2017 | Fisher et al. |
| 2017/0286725 A1 | 10/2017 | Lewis |
| 2018/0061196 A1 | 3/2018 | Busby et al. |
| 2018/0070444 A1 | 3/2018 | Brodsky et al. |
| 2018/0082556 A1 | 3/2018 | Dragone et al. |
| 2018/0092203 A1 | 3/2018 | Dragone et al. |
| 2018/0092204 A1 | 3/2018 | Dragone et al. |
| 2018/0096173 A1 | 4/2018 | Brodsky et al. |
| 2018/0098423 A1 | 4/2018 | Brodsky et al. |
| 2018/0098424 A1 | 4/2018 | Busby et al. |
| 2018/0102329 A1 | 4/2018 | Busby et al. |
| 2018/0103537 A1 | 4/2018 | Brodsky et al. |
| 2018/0103538 A1 | 4/2018 | Brodsky et al. |
| 2018/0107848 A1 | 4/2018 | Campbell et al. |
| 2018/0108229 A1 | 4/2018 | Busby et al. |
| 2018/0110142 A1 | 4/2018 | Fisher et al. |
| 2018/0110165 A1 | 4/2018 | Fisher et al. |
| 2018/0235081 A1 | 8/2018 | Brodsky et al. |

FOREIGN PATENT DOCUMENTS

| | | | |
|---|---|---|---|
| DE | 19816571 A1 | 10/1999 | |
| DE | 19816572 A1 | 10/1999 | |
| DE | 10-2012-203955 A1 | 9/2013 | |
| EP | 0 056 360 A1 | 10/1993 | |
| EP | 0 629 497 A2 | 12/1994 | |
| EP | 1 734 578 A1 | 12/2006 | |
| EP | 1 968 362 A2 | 9/2008 | |
| EP | 2 104 407 A1 | 9/2009 | |
| EP | 1 672 464 B1 | 4/2012 | |
| EP | 2 560 467 A1 | 2/2013 | |
| JP | 61-297035 A | 12/1986 | |
| JP | 2000-238141 A | 9/2000 | |
| JP | 2007-173416 A | 7/2007 | |
| JP | 2007-305761 A | 11/2007 | |
| JP | 2013-125807 A | 6/2013 | |
| JP | 2013-140112 A | 7/2013 | |
| WO | WO 1999/003675 A1 | 1/1999 | |
| WO | WO 1999/021142 A1 | 4/1999 | |
| WO | WO 2001/063994 A2 | 8/2001 | |
| WO | WO 2003/012606 A2 | 2/2003 | |
| WO | WO 2003/025080 A1 | 3/2003 | |
| WO | WO 2004/040505 A1 | 5/2004 | |
| WO | WO 2009/042335 A1 | 4/2009 | |
| WO | WO 2009/092472 A1 | 7/2009 | |
| WO | WO 2010/128939 A1 | 11/2010 | |
| WO | WO 2013/004292 A1 | 1/2013 | |
| WO | WO 2013/189483 A1 | 12/2013 | |
| WO | WO 2014/086987 A2 | 6/2014 | |
| WO | WO 2014/158159 A1 | 10/2014 | |

OTHER PUBLICATIONS

Clark, Andrew J., "Physical Protection of Cryptographic Devices", Advanced in Cyprtology, Eurocrypt '87, Springer, Berlin Heidelberg (1987) (11 pages).

Halperin et al., "Latent Open Testing of Electronic Packaging", MCMC-194, IEEE (1994) (pp. 83-33).

Simek, Bob, "Tamper Restrictive Thermal Ventilation System for Enclosures Requiring Ventilation and Physical Security", IBM Publication No. IPCOM000008607D, Mar. 1, 1998 (2 pages).

NIST, "Security Requirements for Cryptographic Modules", FIPS Pub. 140-2, Issued May 25, 2001.

Pamula et al., "Cooling of Integrated Circuits Using Droplet-Based Microfluidics", Association for Computing Machinery (ACM), GLSVLSI'03, Apr. 28-29, 2003 (pp. 84-87).

Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).

Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).

Drimer et al., "Thinking Inside the Box: System-Level Failures of Tamper Proofing", 2008 IEEE Symposium on Security and Privacy, (Feb. 2008) (pp. 281-295).

Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).

Sample et al., "Design of an RFID-Based Battery-Free Programmable Sensing Platform", IEEE Transactions on Instrumentation and Measurement, vol. 57, No. 11, Nov. 2008 (pp. 2608-2615).

Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).

Anonymous, "Consolidated Non-Volatile Memory in a Chip Stack", IBM Technical Disclosure: IP.com No. IPCOM000185250, Jul. 16, 2009 (6 pages).

Isaacs et al., "Tamper Proof, Tamper Evident Encryption Technology", Pan Pacific Symposium SMTA Proceedings (2013) (9 pages).

Wikipedia, "Toughened Glass", http://web.archive.org/web/20140605093019/https://en.wikipedia.org/wiki/toughened_glass, downloaded/printed Jun. 5, 2014 (4 pages).

Anonymous, "Selective Memory Encryption", IBM Technical Disclosure: IP.com IPCOM000244183, Nov. 20, 2015 (6 pages).

Zhou et al., "Nonlinear Analysis for Hardware Trojan Detection", ICSPCC2015, IEEE (2015) (4 pages).

Harting Mitronics, "Saftey Caps for Payment Terminals", http://harting-mitronics.ch/fileadmin/hartingmitronics/case_studies/Saftey_caps_for_payment_terminals.pdf, downloaded Aug. 2016 (2 pages).

Gold Phoenix Printed Circuit Board, "Why multilayer pcb is used so widely?", May 7, 2012, accessed online @ [http://www.goldphoenixpcb.com/html/Support_Resource/others/arc_110.html] on Feb. 15, 2017.

Busby et al., "Enclosure-to-Board Interface with Tamper-Detect Circuit(s)", U.S. Appl. No. 15/901,985, filed Feb. 22, 2018 (59 pages).

Brodsky et al., "Tamper-Respondent Sensors with Liquid Crystal Polymer Layers", U.S. Appl. No. 15/944,898, filed Apr. 4, 2018 (59 pages).

Busby et al., "Tamper-Proof Electronic Packages with Stressed Glass Component Substrate(s)", U.S. Appl. No. 16/045,868, filed Jul. 26, 2018 (53 pages).

Busby et al., "Tamper-Proof Electronic Packages with Stressed Glass Component Substrate(s)", U.S. Appl. No. 16/045,880, filed Jul. 26, 2018 (55 pages).

Busby et al., "Multi-Layer Stack with Embedded Tamper-Detect Protection", U.S. Appl. No. 16/048,622, filed Jul. 30, 2018 (64 pages).

Busby et al., "Multi-Layer Stack with Embedded Tamper-Detect Protection", U.S. Appl. No. 16/048,634, filed Jul. 30, 2018 (65 pages).

Busby et al., "Multi-Layer Stack with Embedded Tamper-Detect Protection", U.S. Appl. No. 16/048,650, filed Jul. 30, 2018 (68 pages).

Brodsky et al., "Circuit Boards and Electronic Packages with Embedded Tamper-Respondent Sensor", U.S. Appl. No. 16/136,589, filed Sep. 20, 2018 (45 pages).

Brodsky et al., "List of IBM Patents and Patent Applications Treated as Related", U.S. Appl. No. 16/162,679, filed Oct. 17, 2018, dated Oct. 17, 2018 (3 pages).

* cited by examiner

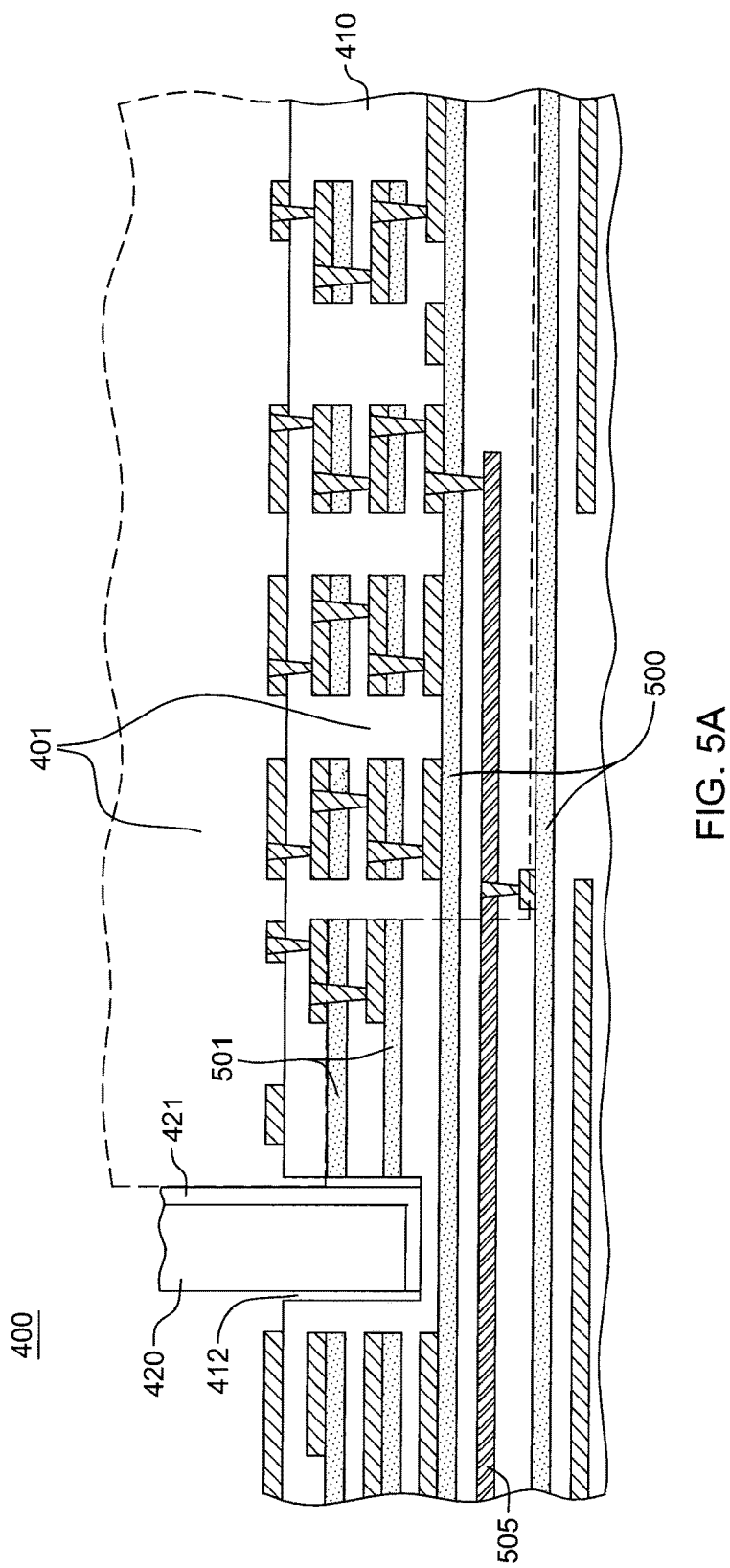

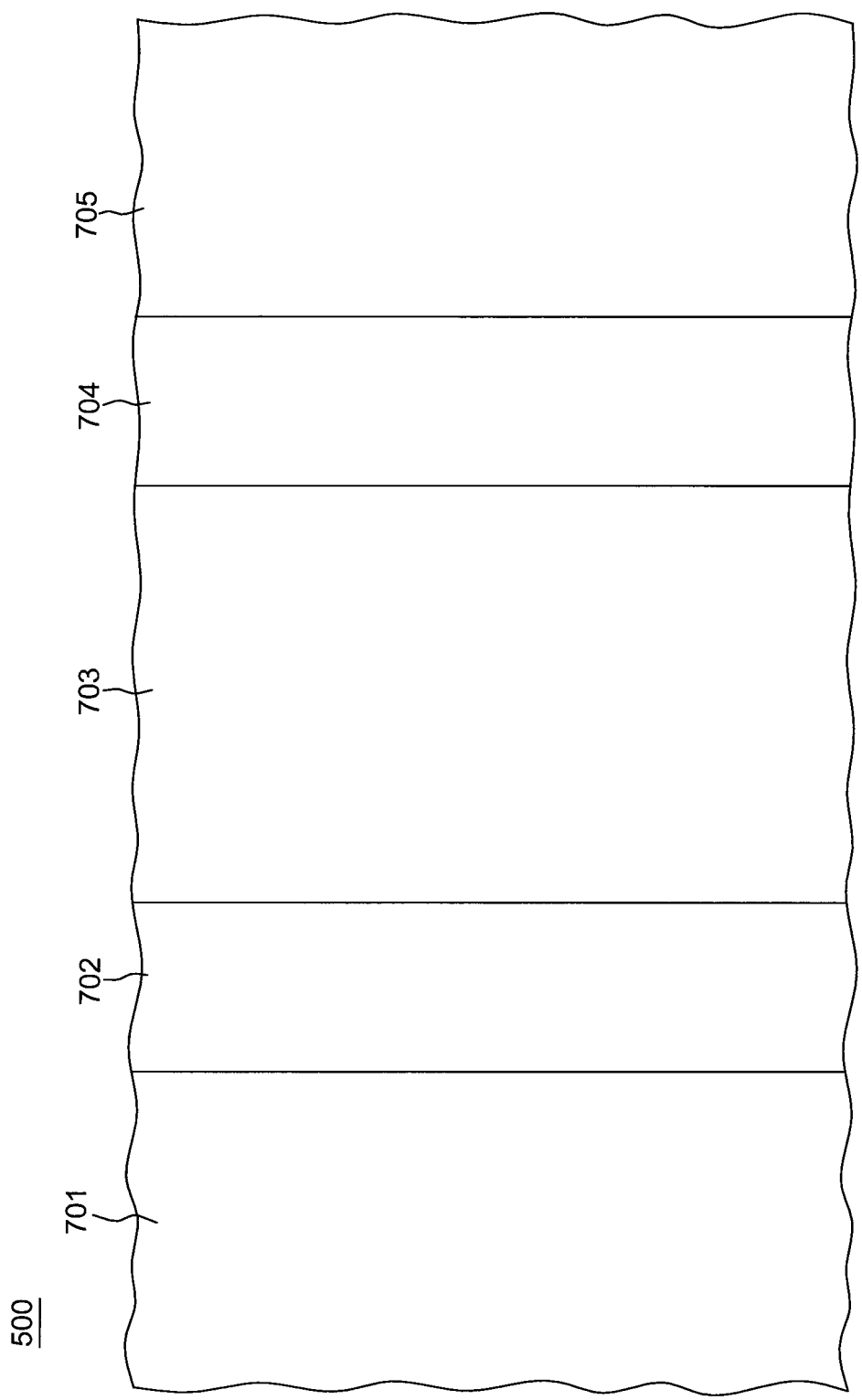

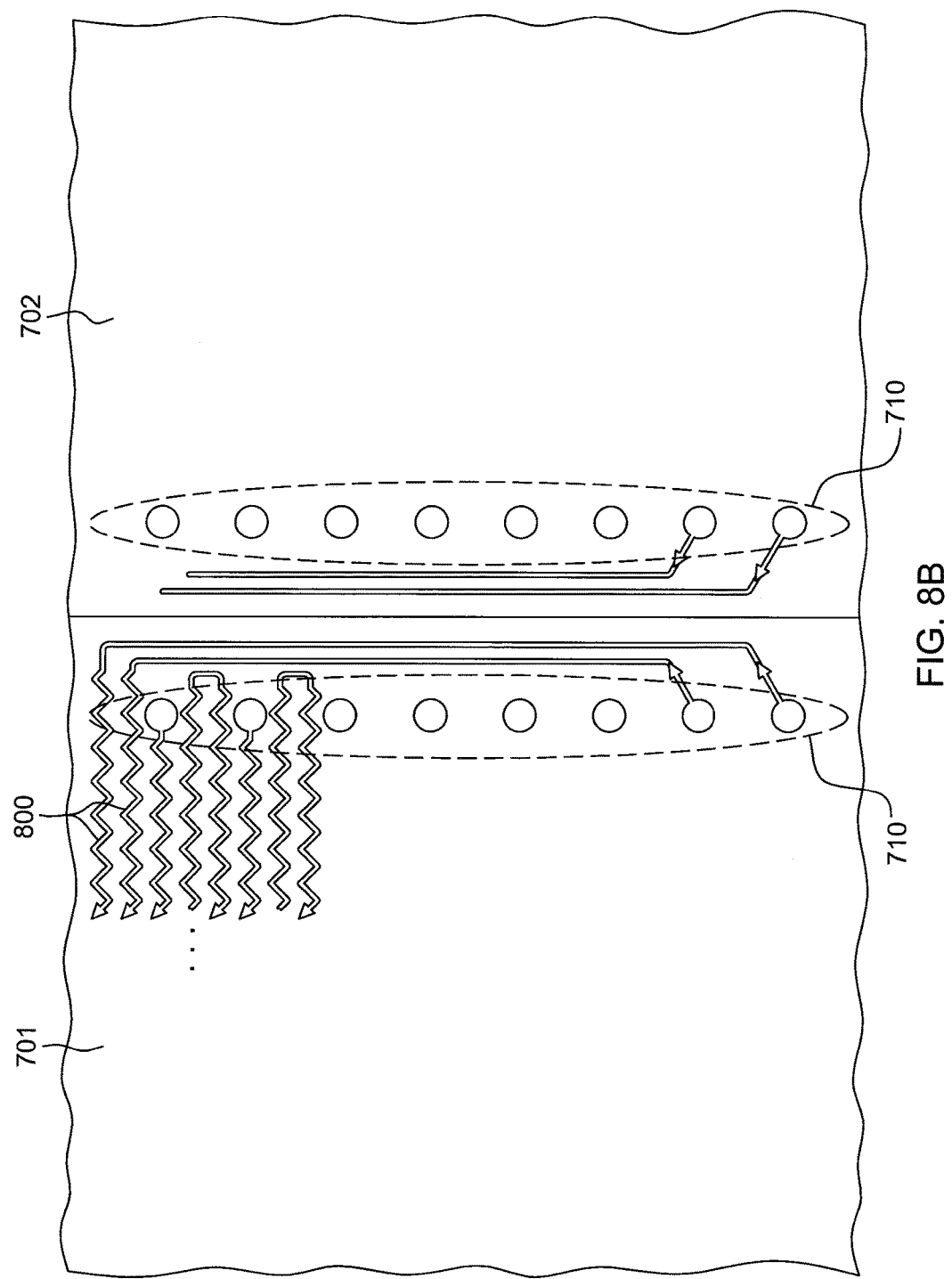

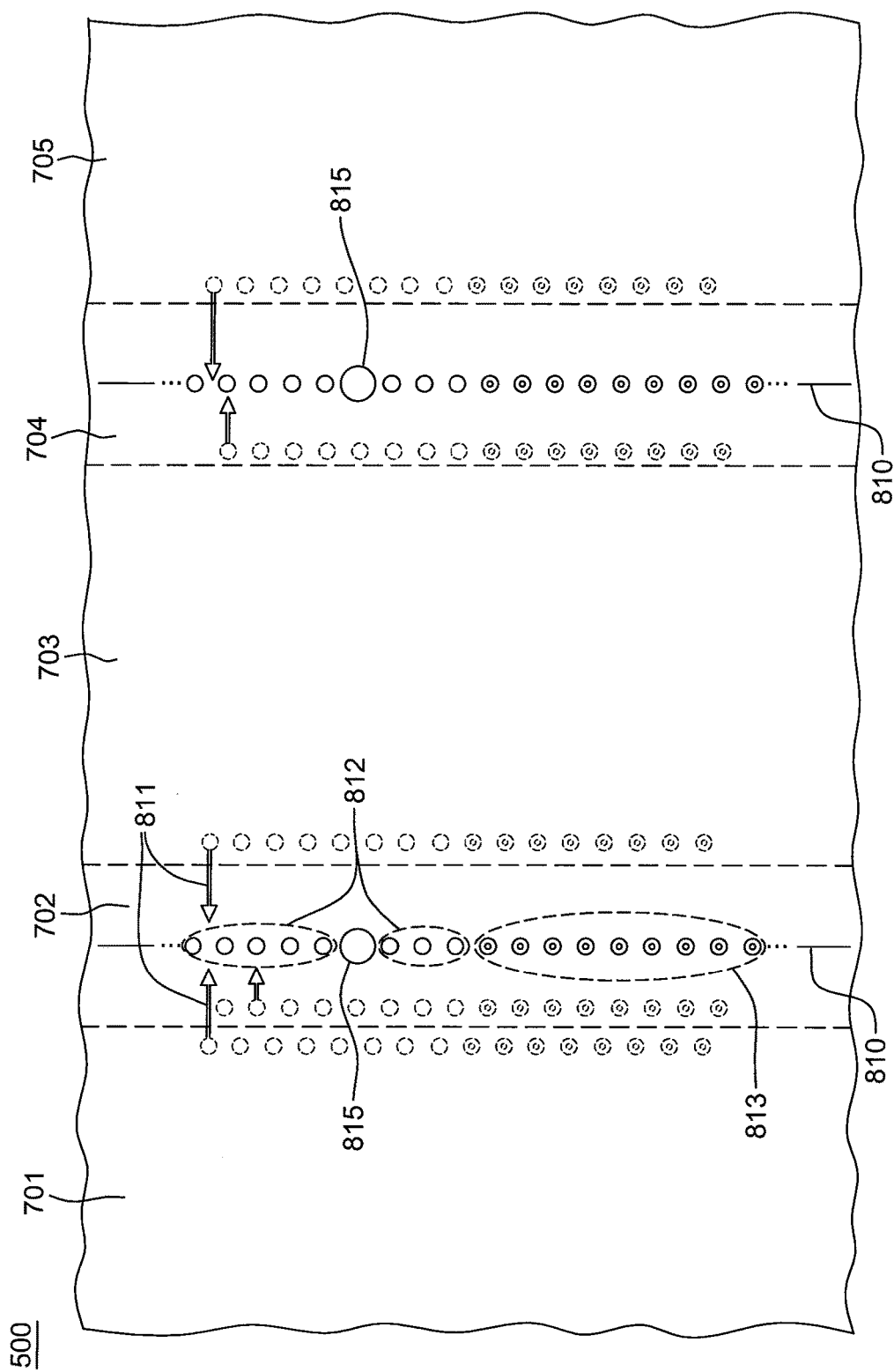

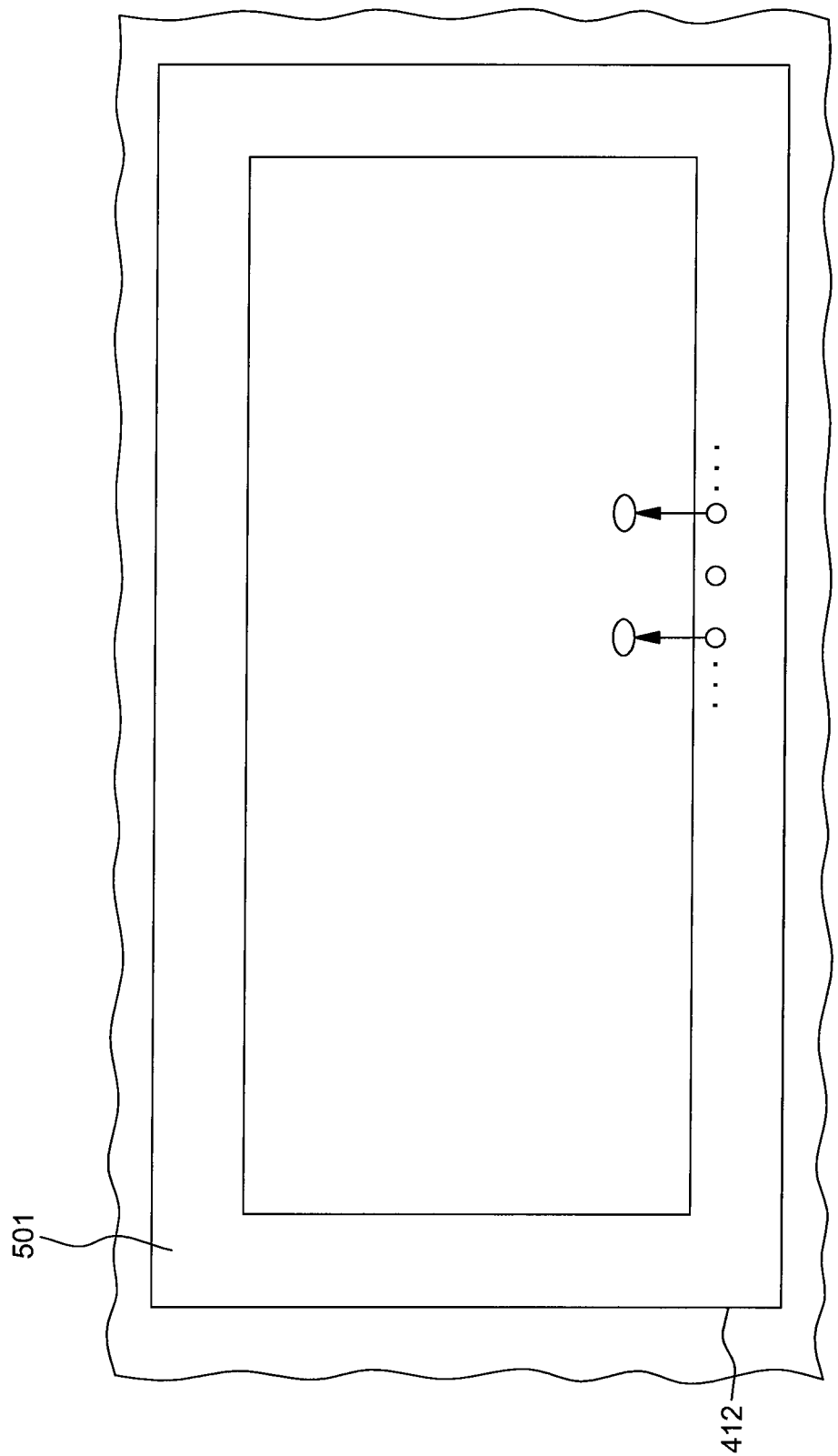

CIRCUIT BOARDS AND ELECTRONIC PACKAGES WITH EMBEDDED TAMPER-RESPONDENT SENSOR

BACKGROUND

Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security sensor, and encapsulated with polyurethane resin. A security sensor may be, in one or more embodiments, a web or sheet of insulating material with circuit elements, such as closely-spaced, conductive lines fabricated on it. The circuit elements are disrupted if the sensor is torn, and the sensor can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

In the above configuration, the electronic package, or tamper-proof electronic package, may be difficult to test due to the presence of the security sensor wrapped fully around the enclosure. Additionally, in this configuration it is difficult to recover components from the electronic package, for instance, should a manufacturing defect in the package be detected.

SUMMARY

Provided herein, in one or more aspects, is a method of fabricating an electronic circuit. The method includes providing a multilayer circuit board, and providing a tamper-respondent sensor embedded within the multilayer circuit board. The tamper-respondent sensor defines, at least in part, a secure volume associated with the multilayer circuit board. The tamper-respondent sensor includes multiple tamper-respondent layers within the multilayer circuit board. The multiple tamper-respondent layers are spaced apart, parallel layers within the multilayer circuit board that facilitate defining the secure volume, at least in part, within the multilayer circuit board. The multiple tamper-respondent layers include at least one tamper-respondent picture frame-type layer encircling the secure volume within the multilayer circuit board, and at least one tamper-respondent mat layer forming a base of the secure volume within the multilayer circuit board. A tamper-respondent picture frame-type layer of the at least one tamper-respondent picture frame-type layer includes one or more conductive trace lines extending horizontally within the tamper-respondent picture frame-type layer within the multilayer circuit board and encircling the secure volume within the multilayer circuit board. The at least one tamper-respondent frame layer is disposed over the at least one tamper-respondent mat layer.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5A is a partial cross-sectional elevational view of a tamper-proof electronic package comprising an electronic circuit with a multilayer circuit board and embedded tamper-respondent sensor, in accordance with one or more aspects of the present invention;

FIG. 7 is a plan view of one embodiment of a tamper-respondent mat layer for a tamper-respondent sensor embedded within a multilayer circuit board, in accordance with one or more aspects of the present invention;

FIG. 8B is a partial plan view of the tamper-respondent mat layer of FIG. 8A, showing a portion of the conductive traces provided within two adjacent circuit zones of the tamper-respondent mat layer, in accordance with one or more aspects of the present invention;

FIG. 8C is a plan view of a wiring layer overlying the tamper-respondent mat layer of FIG. 8A, and illustrating an offsetting of the conductive vias from the tamper-respondent mat layer of FIG. 8A to selected locations within the wiring layer, which also accommodate (in the depicted example) external signal line vias facilitating communication to and from the secure volume associated with the multilayer circuit board, in accordance with one or more aspects of the present invention;

FIG. 8G is a plan view of a second tamper-respondent frame overlying the first tamper-respondent frame, and further facilitating defining the secure volume in association with the multilayer circuit board, in accordance with one or more aspects of the present invention.

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, and wherein the same reference numbers used throughout different figures designate the same or similar components.

Figure 1:
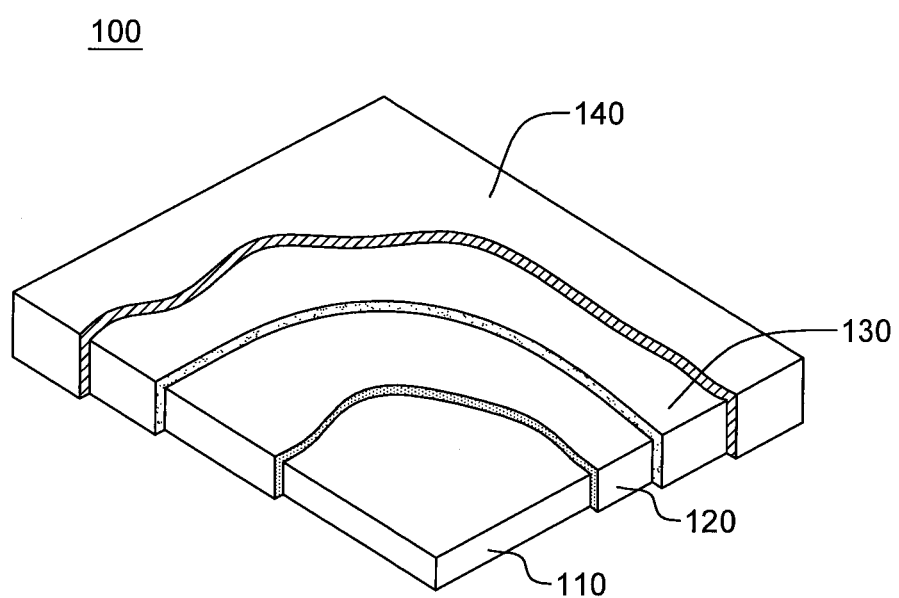
FIG. 1 is a partial cut-away of a conventional tamper-proof electronic package.

Reference is first made to FIG. 1 of the drawings, which illustrates one embodiment of an electronic package 100 configured as a tamper-proof electronic package for purposes of discussion. In the depicted embodiment, an enclosure 110 is provided containing, for instance, an electronic assembly, which in one embodiment may include a plurality of electronic components, such as an encryption module and associated memory. The encryption module may comprise security-sensitive information with, for instance, access to the information stored in the module requiring use of a variable key, and with the nature of the key being stored in the associated memory within the enclosure.

In one or more implementations, a tamper-proof electronic package such as depicted is configured or arranged to detect attempts to tamper-with or penetrate into enclosure 110. Accordingly, enclosure 110 also includes, for instance, a monitor circuit which, if tampering is detected, activates an erase circuit to erase information stored within the associated memory, as well as the encryption module within the communications card. These components may be mounted on, and interconnected by, a printed circuit board or other substrate, and be internally powered via a power supply provided within the enclosure.

In the embodiment illustrated, and as one example only, enclosure 110 is surrounded by a tamper-respondent sensor 120, an encapsulant 130, and an outer, thermally conductive enclosure 140. In one or more implementations, tamper-respondent sensor 120 may comprise a folded, tamper-respondent laminate, and encapsulant 130 may be provided in the form of a molding. Tamper-respondent sensor 120 may include various detection layers, which are monitored via a ribbon cable (discussed below) by the enclosure monitor, against sudden violent attempts to penetrate enclosure 110 and damage the enclosure monitor or erase circuit before information can be erased from the encryption module. The tamper-respondent sensor may be, for example, any such article commercially available or described in various publications and issued patents.

By way of example, tamper-respondent sensor 120 may be formed as a tamper-respondent laminate comprising a number of separate layers with, for instance, an outermost lamination-respondent layer including a matrix of diagonally-extending, semi-conductive lines printed onto a regular, thin insulating film. The matrix of lines forms a number of continuous conductors which would be broken if attempts are made to penetrate the film. The lines may be formed, for instance, by printing carbon-loaded Polymer Thick Film, PTF, ink onto the film, and selectively connecting the lines on each side, by conductive vias at the edges of the film. Connections between the lines and an enclosure monitor of the communications card may be provided via, for instance, one or more ribbon cables. The ribbon cable itself may be formed of lines of carbon-loaded ink printed onto an extension of the film, if desired. Connections between the matrix and the ribbon cable may be made via connectors formed on one edge of the film. As noted, the laminate may be folded to define the tamper-respondent sensor 120 surrounding enclosure 110.

In one or more implementations, the various elements of the laminate may be adhered together and folded around enclosure 110, in a similar manner to gift-wrapping a parcel, to define the tamper-respondent sensor 120. The assembly may be placed in a mold which is then filled with, for instance, cold-pour polyurethane, and the polyurethane may be cured and hardened to form an encapsulant 130. The encapsulant may, in one or more embodiments, completely surround the tamper-respondent sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

Note that, as an enhancement, within a sealed electronic package, such as the tamper-proof electronic package depicted in FIG. 1 and described above, structures and methods for facilitating heat transfer from one or more electronic components disposed therein outwards through the enclosure and any other layers of the electronic package may be provided.

Figure 2:
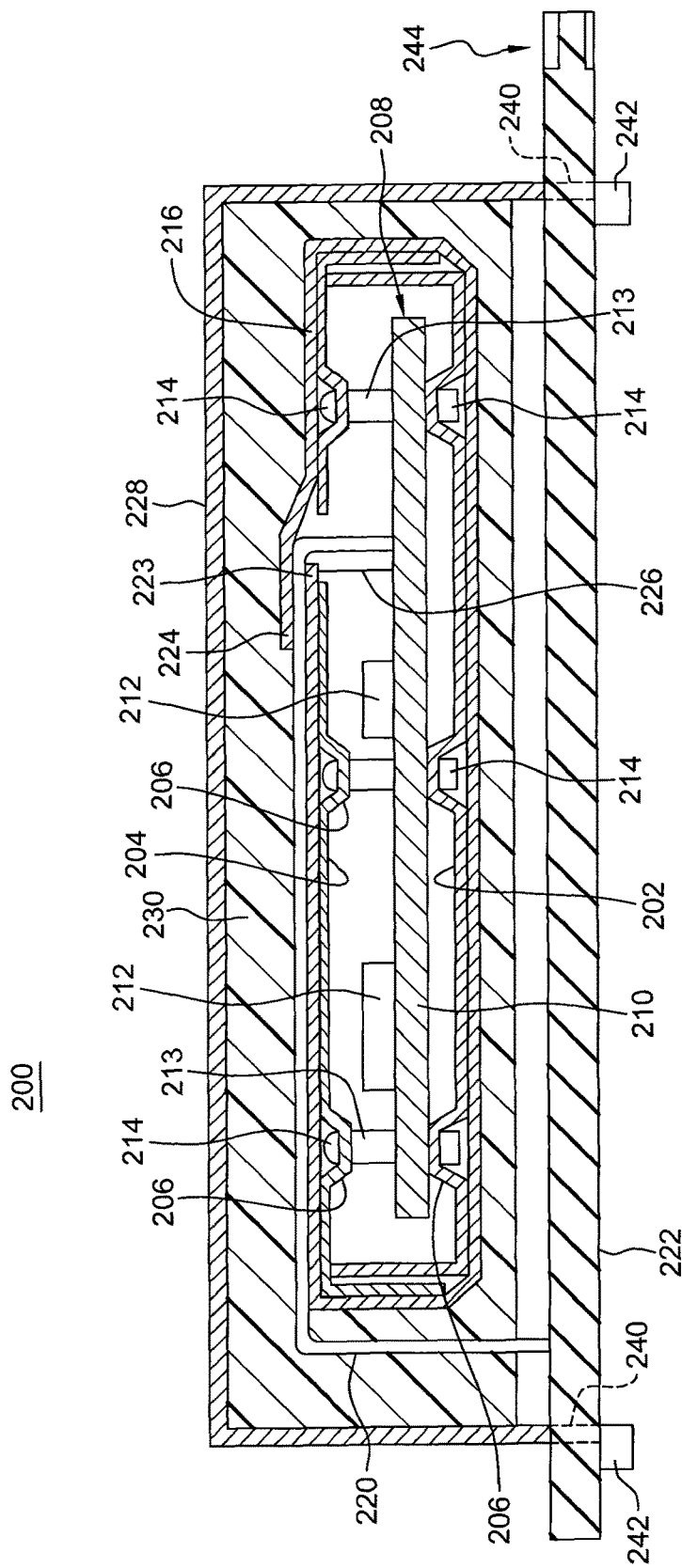
FIG. 2 is a cross-sectional elevational view of one embodiment of a prior art, tamper-proof electronic package comprising an electronic circuit.

FIG. 2 depicts in detail one embodiment of a tamper-proof electronic package 200. Electronic package 200 is defined by, for instance, a base metal shell 202 and a top metal shell 204. Outer surfaces of base metal shell 202 and top metal shell 204 may be provided with dimples 206, with an electronic assembly 208 resting on dimples 206 defined in base metal shell 202. Electronic assembly 208 may include, for instance, a printed circuit board 210 with electronic components 212 that are electrically connected via conductors (not shown) defined within or on printed circuit board 210.

Hollow spacers 213 may be placed below dimples 206 in top metal shell 204, and rivets 214 provided, extending through openings in dimples 206, through hollow spacers 213 and through openings in printed circuit board 210 to base metal shell 202 in order to fixedly secure electronic assembly 208 within the enclosure formed by base and top metal shells 202, 204. A security mesh or tamper-respondent sensor 216 is wrapped around the top, base, and four sides of the enclosure formed by base and top metal shells 202, 204. As illustrated, in one or more embodiments, top metal shell 204 may have an opening through which a bus 220 extends. One end of bus 220 may be connected to conductors (not shown) on printed circuit board 210, and the other end may be connected to conductors (not shown) on a printed circuit board 222. As bus 220 passes through the opening, the bus extends between an inner edge region 223 of the security mesh 216 and an overlapping, outer edge region 224 of the security mesh 216. A group of wires 226 connect, in one embodiment, security mesh 216 to conductors on printed circuit board 210. Circuitry on printed circuit board 210 is responsive to a break in security mesh 216, in which case, an alarm signal may be emitted on bus 220, and also encryption/decryption keys stored within electronic assembly 208 may be erased.

In one or more implementations, liquid polyurethane resin may be applied to security mesh 216 and cured. An outer, thermally conductive enclosure 228, such as a copper enclosure, may be filled with liquid polyurethane resin with the electronic assembly and inner enclosure and security mesh suspended within it. Upon curing the resin, the electronic assembly and inner enclosure and security mesh become embedded in a polyurethane block or encapsulant 230, as shown. The enclosure 228 is mounted on the printed circuit board 222, which can be accomplished using, for instance, legs 240 which extend through slots in printed circuit board 222 and terminate in flanges 242, which are then bent out of alignment with the slots. Bus 220 may be connected, by way of printed circuit board 222 to connectors 244 located along, for instance, one edge of printed circuit board 222.

Figure 3:
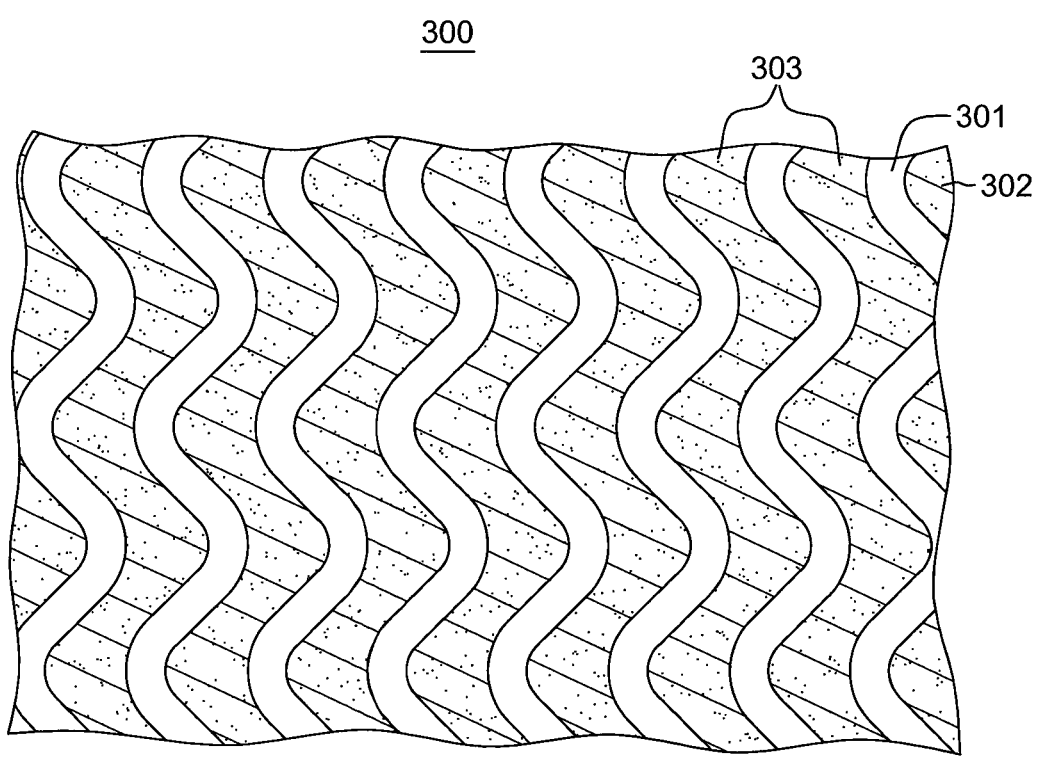
FIG. 3 depicts one embodiment of a tamper-respondent trace pattern or circuit which may be employed within a tamper-respondent sensor, in accordance with one or more aspects of the present invention.

FIG. 3 depicts a portion of one embodiment of a tamper-respondent layer 300 (or laser and pierce-respondent layer) for a tamper-respondent sensor or security mesh, for instance, such as described above in connection with FIGS. 1 & 2. In FIG. 3, the tamper-respondent layer 300 includes tracks or traces 301 of, for instance, carbon-loaded polyester ink printed onto one or both opposite sides of an electrically-insulating film 302. FIG. 3 illustrates traces 301 on, for instance, one side of film 302, with the traces on the opposite side of the film being, for instance, the same pattern, but offset to lie directly below spaces 303, between traces 301. The traces are of a width and pitch that piercing of the film 302 at any point results in damage to at least one of the traces. In one or more implementations, the traces are electrically connected in-series to define one or more conductors which are electrically connected to the enclosure monitor, which monitors the resistance of the traces or lines. Detection of an increase in resistance, caused by cutting one of the traces, will cause information within the encryption module to be erased. Providing traces 301 in a saw tooth or sinusoidal pattern advantageously makes it more difficult to breach film 302 without detection.

In the configuration of FIGS. 1-2, the electronic package, or tamper-proof electronic package, may be difficult to test due (in part) to the presence of the security mesh wrapped fully around the enclosure. Additionally, in this configuration, it is difficult to recover one or more electronic components from the electronic package should, for instance, a manufacturing defect in the package be detected.

Disclosed hereinbelow with reference to FIGS. 4A-9 are alternate approaches to creating a secure volume for accommodating one or more electronic components, such as one or more encryption and/or decryption modules and associated components of a communications card.

Figure 4A:
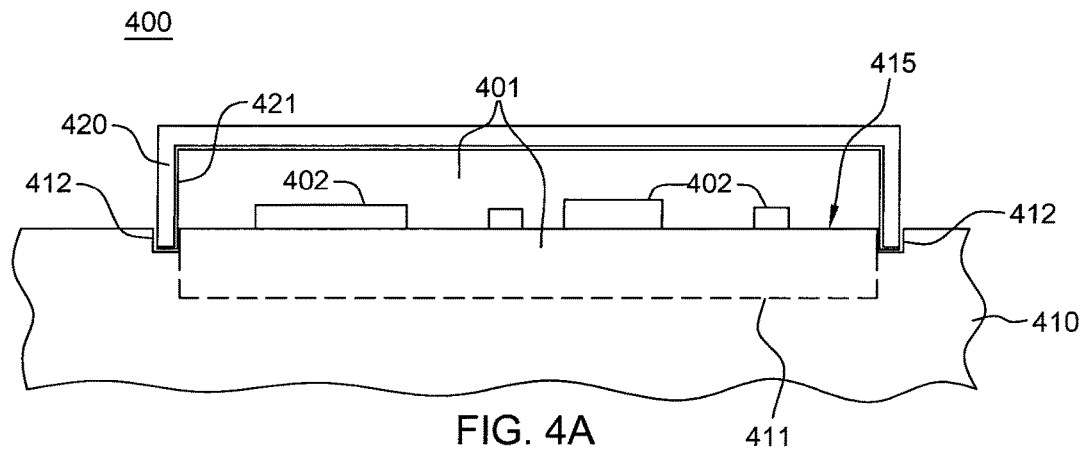
FIG. 4A is a cross-sectional elevational view of one embodiment of a tamper-proof electronic package, which includes a tamper-respondent sensor embedded within a multilayer circuit board, in accordance with one or more aspects of the present invention.
Figure 4B:
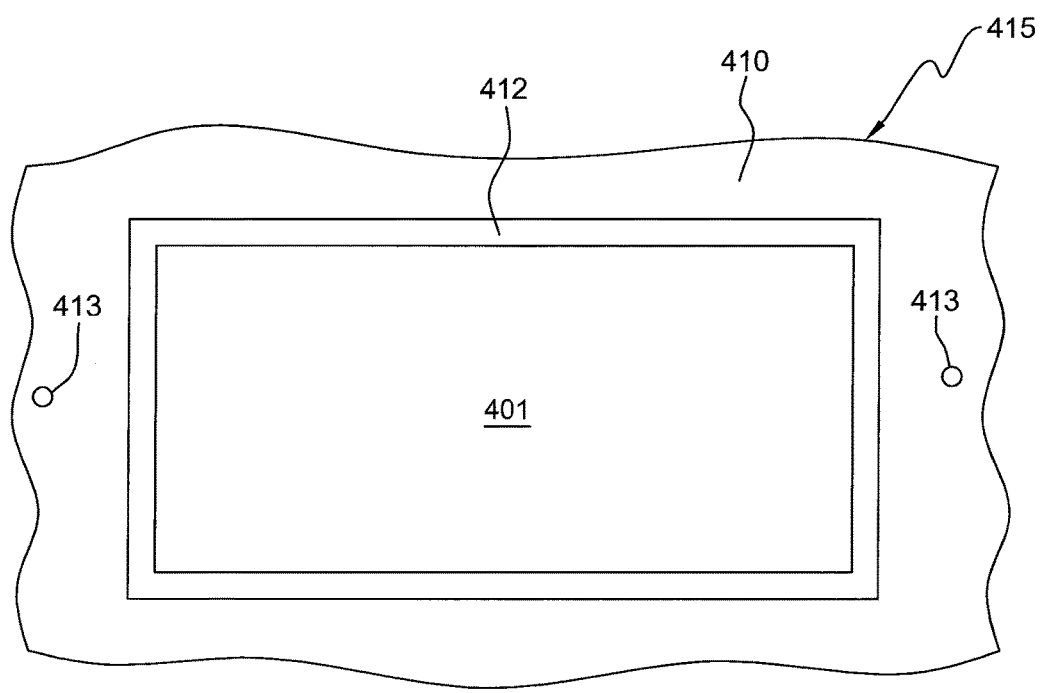
FIG. 4B is a top plan view of the multilayer circuit board of FIG. 4A, depicting one embodiment of the secure volume where defined within the multilayer circuit board, in accordance with one or more aspects of the present invention.

FIGS. 4A & 4B depict one embodiment of an electronic package, or tamper-proof electronic package 400, comprising an electronic circuit 415, in accordance with one or more aspects of the present invention.

Referring collectively to FIGS. 4A & 4B, electronic circuit 415 includes a multilayer circuit board 410 which has a tamper-respondent sensor 411 embedded therein that facilitates defining, in part, a secure volume 401 associated with multilayer circuit board 410 that extends into multilayer circuit board 410. In particular, in the embodiment of FIGS. 4A & 4B, secure volume 401 exists partially within multilayer circuit board 410, and partially above multilayer circuit board 410. One or more electronic components 402 are mounted to multilayer circuit board 410 within secure volume 401 and may comprise, for instance, one or more encryption modules and/or decryption modules, and associated components, with the tamper-proof electronic package comprising, in one or more embodiments, a communications card of a computer system.

Tamper-proof electronic package 400 further includes an enclosure 420, such as a pedestal-type enclosure, mounted to multilayer circuit board 410 within, for instance, a continuous groove (or trench) 412 formed within an upper surface of multilayer circuit board 410. In one or more embodiments, enclosure 420 may comprise a thermally conductive material and operate as a heat sink for facilitating cooling of the one or more electronic components 402 within the secure volume. A security mesh 421, such as the above-described security meshes, may be associated with enclosure 420, for example, wrapping around the inner surface of enclosure 420 to facilitate defining, in combination with tamper-respondent sensor 411 embedded within multilayer circuit board 410, secure volume 401. In one or more implementations, security mesh 421 extends down into continuous groove 412 in multilayer circuit board 410 and may, for instance, even wrap partially or fully around the lower edge of enclosure 420 within continuous groove 412 to provide enhanced tamper detection where enclosure 420 couples to multilayer circuit board 410. In one or more implementations, enclosure 420 may be securely affixed to multilayer circuit board 410 using, for instance, a bonding material such as an epoxy or other adhesive.

As depicted in FIG. 4B, one or more external circuit connection vias 413 may be provided within multilayer circuit board 410 for electrically connecting to the one or more electronic components 402 (FIG. 4A) within secure volume 401. These one or more external circuit connection vias 413 may electrically connect to one or more external signal lines or planes (not shown) embedded within multilayer circuit board 410 and extending, for instance, into a secure base region of (or below) secure volume 401, as explained further below. Electrical connections to and from secure volume 401 may be provided by coupling to such external signal lines or planes within the multilayer circuit board 410.

As noted with reference to FIGS. 4A & 4B, secure volume 401 defined in association with multilayer circuit board 410 may be sized to house electronic components 402 to be protected, and be constructed to extend into multilayer circuit board 410. In one or more implementations, multilayer circuit board 410 includes electrical interconnect within the secure volume 401 defined in the board, for instance, for electrically connecting the multiple tamper-respondent layers of the embedded tamper-respondent sensor 411 to associated monitor circuitry also disposed within secure volume 401.

Note that the embodiment depicted in FIGS. 4A & 4B is presented by way of example only. In one or more other implementations, the electronic circuit may comprise multiple multilayer circuit boards, each with a tamper-respondent sensor embedded within the multilayer circuit board with an appropriate connector, located within a secure volume defined between two adjacent multilayer circuit boards, interconnecting selected wiring of the multilayer circuit boards. In such an implementation, the overlying multilayer circuit board could be hollowed out to accommodate, for instance, the connector and/or one or more other electronic components between the multilayer circuit boards. In addition, other configurations of enclosure 420, and/or other approaches to coupling enclosure 420 and multilayer circuit board 410 may be employed.

By way of further example, FIG. 5A depicts a partial cross-sectional elevational view of one embodiment of multilayer circuit board 410 and enclosure 420. In this configuration, the embedded tamper-respondent sensor includes multiple tamper-respondent layers including, by way of example, at least one tamper-respondent mat (or base) layer 500, and at least one tamper-respondent frame 501. In the example depicted, two tamper-respondent mat layers 500 and two tamper-respondent frame 501 are illustrated, by way of example only. The lower-most tamper-respondent mat layer 500 may be a continuous sense or detect layer extending completely below the secure volume being defined within multilayer circuit board 410. One or both tamper-respondent mat layers 500 below secure volume 401 may be partitioned into multiple circuit zones, as discussed further below. Within each tamper-respondent mat layer, or more particularly, within each circuit zone of each tamper-respondent mat layer, multiple circuits or conductive traces are provided in any desired configuration, such as the configuration described above in connection with FIG. 3. Further, the conductive traces within the tamper-respondent layers may be implemented as, for instance, a resistive layer which is difficult to attach shunt circuits to, as explained further below.

As illustrated, one or more external signal lines or planes 505 enter secure volume 401 between, in this embodiment, two tamper-respondent mat layers 500, and then electrically connect upwards into the secure volume 401 through one or more conductive vias, arranged in any desired location and pattern. In the configuration depicted, the one or more tamper-respondent frames 501 are disposed at least inside of the area defined by continuous groove 412 accommodating the base of enclosure 420. Together with security mesh 421 associated with enclosure 420, tamper-respondent frames 501 define secure volume 401 where extending, in part, into multilayer circuit board 410. With secure volume 401 defined, at least in part, within multilayer circuit board 410, the external signal line(s) 505 may be securely electrically connected to, for instance, the one or more electronic components 402 (FIG. 4A) mounted to multilayer circuit board 410 within secure volume 401. In addition, the secure volume 401 may accommodate electrical interconnection of the conductive traces of the multiple tamper-respondent layers, for instance, via appropriate monitor circuitry.

Figure 5B:
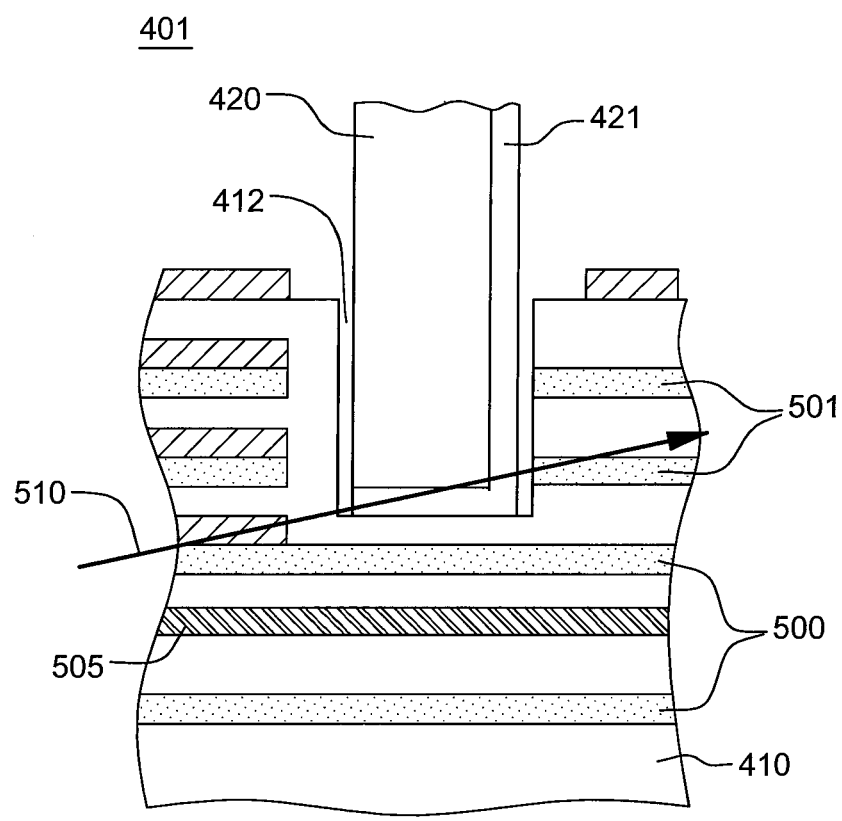
FIG. 5B is a schematic of a portion of the tamper-proof electronic package of FIG. 5A, in accordance with one or more aspects of the present invention.

As illustrated by the schematic of FIG. 5B, added security may be provided by extending tamper-respondent mat layers 500 (and if desired, tamper-respondent frames 501) outward past continuous groove 412 accommodating enclosure 420. In this manner, a line of attack 510 may be made more difficult at the interface between enclosure 420 and multilayer circuit board 410 since the attack 510 would need to clear tamper-respondent mat layers 500, the bottom edge of security mesh 421 associated with enclosure 420, as well as the tamper-respondent frames 501 of the embedded tamper-respondent sensor.

Figure 5C:
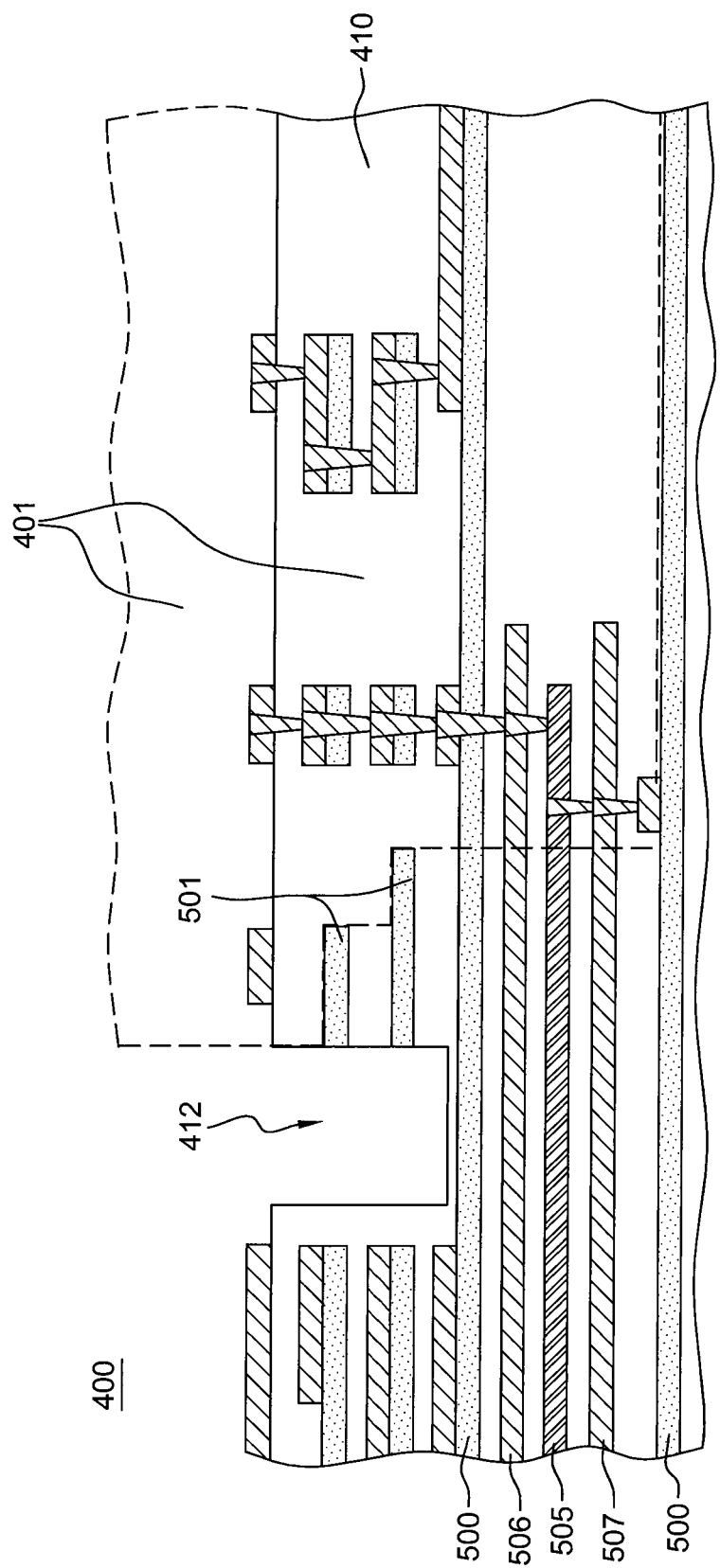
FIG. 5C depicts an alternate embodiment of an electronic circuit comprising a multilayer circuit board and an embedded tamper-respondent sensor, in accordance with one or more aspects of the present invention.

FIG. 5C depicts a variation on the multilayer circuit board 410 of FIG. 5A. In this embodiment, the embedded tamper-respondent sensor again includes multiple tamper-respondent mat layers 500 and multiple tamper-respondent frames 501, such as described above. Additionally, a tri-plate structure is provided comprising one or more external signal lines or layers 505 sandwiched between an upper ground plane 506 and a lower ground plane 507. In this configuration, high-speed transfer of signals to and from the secure volume, and in particular, to and from the one or more electronic components resident within the secure volume, are facilitated.

Note also that, in this implementation, once within the secure volume is defined within multilayer circuit board 410, conductive vias within the secure volume between layers of multilayer circuit board 410 may be either aligned, or offset, as desired, dependent upon the implementation. Alignment of conductive vias may facilitate, for instance, providing a shortest connection path, while offsetting conductive vias between layers may further enhance security of the tamper-proof electronic package by making an attack into the secure volume through or around one or more tamper-respondent layers of the multiple tamper-respondent layers more difficult.

Each tamper-respondent layer of the embedded tamper-respondent sensor formed within the multilayer circuit board of the electronic circuit or electronic package may include multiple conductive traces or lines formed between, for instance, respective sets of input and output contacts or vias at the trace termination points. Any number of conductive traces or circuits may be employed in defining a tamper-respondent layer or a tamper-respondent circuit zone within a tamper-respondent layer. For instance, 4, 6, 8, etc., conductive traces may be formed in parallel (or otherwise) within a given tamper-respondent layer or circuit zone between the respective sets of input and output contacts to those conductive traces.

Figure 6:
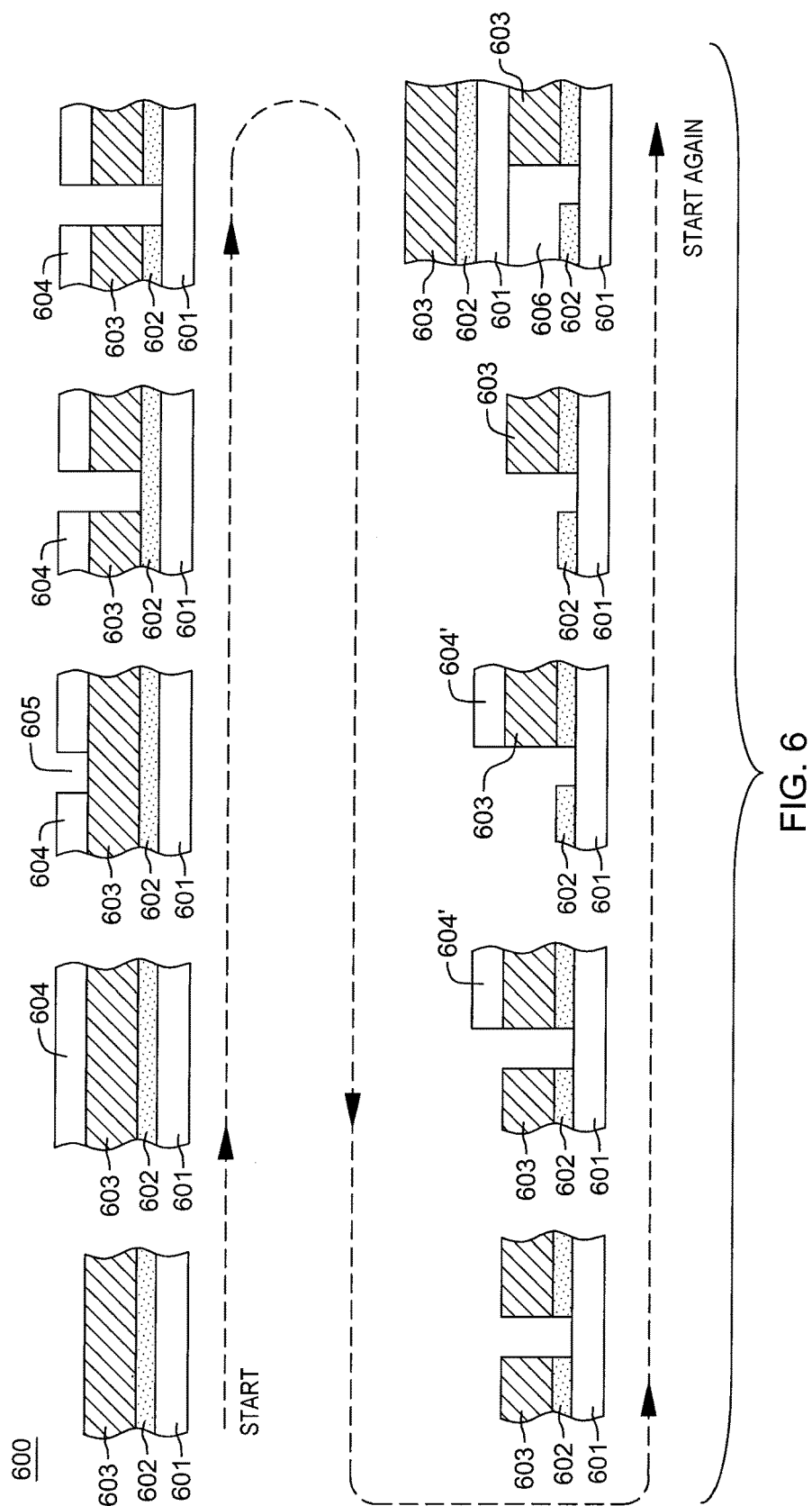
FIG. 6 illustrates one embodiment of a process for fabricating a multilayer circuit board with an embedded tamper-respondent sensor, in accordance with one or more aspects of the present invention.

In one or more implementations, the multilayer circuit board may be a multilayer wiring board or printed circuit board formed, for instance, by building up the multiple layers of the board. FIG. 6 illustrates one embodiment for forming and patterning a tamper-respondent layer within such a multilayer circuit board.

As illustrated in FIG. 6, in one or more implementations, a tamper-respondent layer, such as a tamper-respondent mat layer or a tamper-respondent frame disclosed herein, may be formed by providing a material stack comprising, at least in part, a structural layer 601, such as a pre-preg (or pre-impregnated) material layer, a trace material layer 602 for use in defining the desired trace patterns, and an overlying conductive material layer 603, to be patterned to define conductive contacts or vias electrically connecting to the pattern of traces being formed within the trace material layer 602, for instance, at trace terminal points. In one or more implementations, the trace material layer 602 may comprise nickel phosphorous (NiP), and the overlying conductive layer 603 may comprise copper. Note that these materials are identified by way of example only, and that other trace and/or conductive materials may be used within the build-up layer or stack 600.

A first photoresist 604 is provided over stack 600, and patterned with one or more openings 605, through which the overlying conductive layer 603 may be etched. Depending on the materials employed, and the etch processes used, a second etch process may be desired to remove portions of trace material layer 602 to define the conductive traces of the subject tamper-respondent layer. First photoresist 604 may then be removed, and a second photoresist 604' is provided over the conductive layer 603 features to remain, such as the input and output contacts. Exposed portions of conductive layer 603 are then etched, and the second photoresist 604' may be removed, with any opening in the layer being filled, for instance, with an adhesive (or pre-preg) and a next build-up layer is provided, as shown. Note that in this implementation, most of overlying conductive layer 603 is etched away, with only the conductive contacts or vias remaining where desired, for instance, at the terminal points of the traces formed within the layer by the patterning of the trace material layer 602. Note that any of a variety of materials may be employed to form the conductive lines or traces within a tamper-respondent layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

By way of example, FIG. 7 is a partial plan view of one embodiment of a tamper-respondent mat layer 500 of an embedded tamper-respondent sensor within a multilayer circuit board, in accordance with one or more aspects of the present invention. In this implementation, tamper-respondent mat layer 500 is divided into multiple tamper-respondent circuit zones 701, 702, 703, 704, 705, of varying sizes. Within each tamper-respondent circuit zone 701, 702, 703, 704, 705, conductive traces of the same or different wiring patterns may be provided with, for instance, the larger circuit zones 701, 703, 705, having a same number of traces and similar resistance per trace, per zone. Note that other configurations of tamper-respondent sense zones may be employed, including, for instance, equal or standard-sized circuit zones within a common tamper-respondent layer.

FIGS. 8A-8G depict, by way of example, one embodiment of multiple tamper-respondent layers, and the electrical interconnect associated with the tamper-respondent layers, such as for, for instance, the embedded tamper-respondent sensor depicted in FIG. 5A.

Figure 8A:
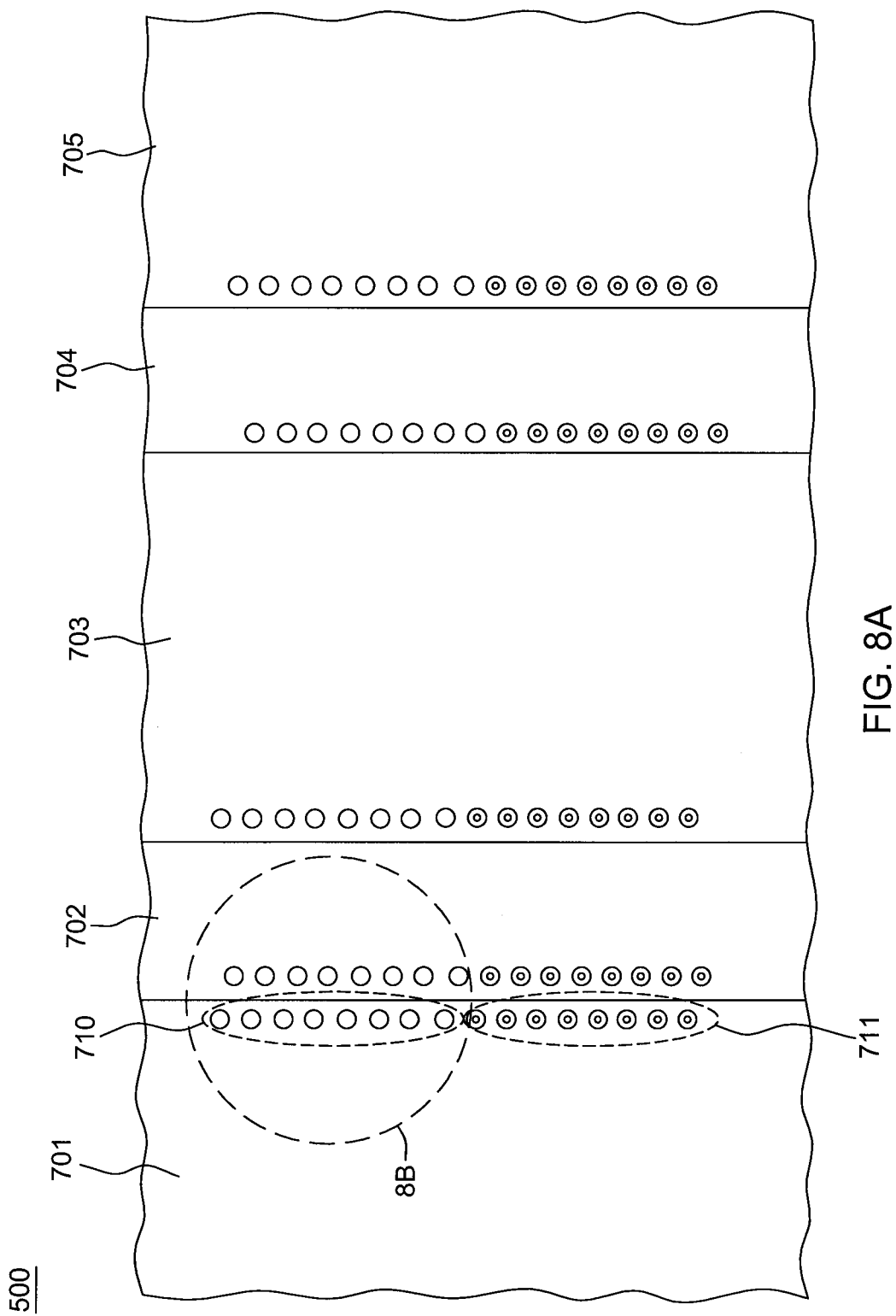
FIG. 8A is a plan view of the tamper-respondent mat layer of FIG. 7, with conductive vias to an upper layer illustrated for electrically connecting to the conductive traces of the different circuit zones of the tamper-respondent mat layer, in accordance with one or more aspects of the present invention.

As illustrated in FIG. 8A, blind contact vias 710, 711 are provided, by way of example, at the edge or boundary of each tamper-respondent circuit zone 701, 702, 703, 704, 705 within a lowermost tamper-respondent mat layer 500. Contact vias 710, 711 facilitate electrical connection from the ends of the conductive traces (not shown) of the depicted tamper-respondent layer upwards into the secure volume for connection to appropriate monitor circuitry in any desired configuration. Note with respect to FIG. 8A, that there are no penetrations through the lowermost tamper-respondent mat layer 500. As explained further below, in one or more implementations, electrical interconnect may be provided above the lowermost tamper-respondent mat layer to shift the overlying contact vias to, for instance, the centers of tamper-respondent circuit zones 702, 704, for instance, to prevent direct penetration of one tamper-respondent layer from passing through other tamper-respondent layers. As noted, any desired number and size of circuit zones of traces may be defined within a tamper-respondent layer. In one or more implementations, a tamper-respondent mat layer may include, for instance, 20, 30, 40, or more, tamper-respondent circuit zones within the layer, each with a same number of traces.

FIG. 8B is a partial enlarged depiction of tamper-respondent mat layer 500 of FIG. 8A, showing a partial boundary between two tamper-respondent circuit zones 701, 702, with input contacts or vias 710 depicted. In this example, an 8-band trace pattern of conductive traces or lines 800 is partially shown within circuit zones 701, 702. As noted, the pattern of conductive traces 800 may be provided in any desired configuration and include, for instance, saw-tooth or sinusoidal line portions within the respective circuit zones 701, 702. FIG. 8B depicts an example of the start of a pattern of the conductive traces 800 where connected to input contacts or vias 710. Configuring conductive traces 800 as illustrated further enhances security by making it harder to reach multiple vias to jump over or shut sections of circuitry within a particular tamper-respondent layer of the embedded tamper-respondent sensor. In one or more implementations the trace fill pattern is dense. Further, line-to-line or trace-to-trace spacing between the different circuit zones of a particular tamper-respondent layer may be the same as that employed within a particular tamper-respondent circuit zone.

FIG. 8C depicts an electrical interconnect layer over tamper-respondent mat layer 500 of FIG. 8A, with wiring illustrated to shift the conductive contacts to offset the vias to, by way of example, the middle of tamper-respondent circuit zones 702, 704. Additionally, this interconnect layer may comprise the external signal lines and contacts for connecting to and from the secure volume to external the secure volume, including, if desired, the provision of one or more high-speed interconnect circuits sandwiched between, for instance, respective ground planes, such as noted above with reference to the exemplary embodiment of FIG. 5C. As illustrated, conductive lines 811 may be provided in this layer electrically connecting contacts 710, 711 of the respective tamper-respondent circuit zones to offset vias 812, 813 disposed, for instance, in alignment 810 over tamper-respondent circuit zones 702, 704. In addition, one or more external signal line contacts 815 may also be provided in this electrical interconnect layer for facilitating electrical connection of the external signal lines into the secure volume.

Figure 8D:
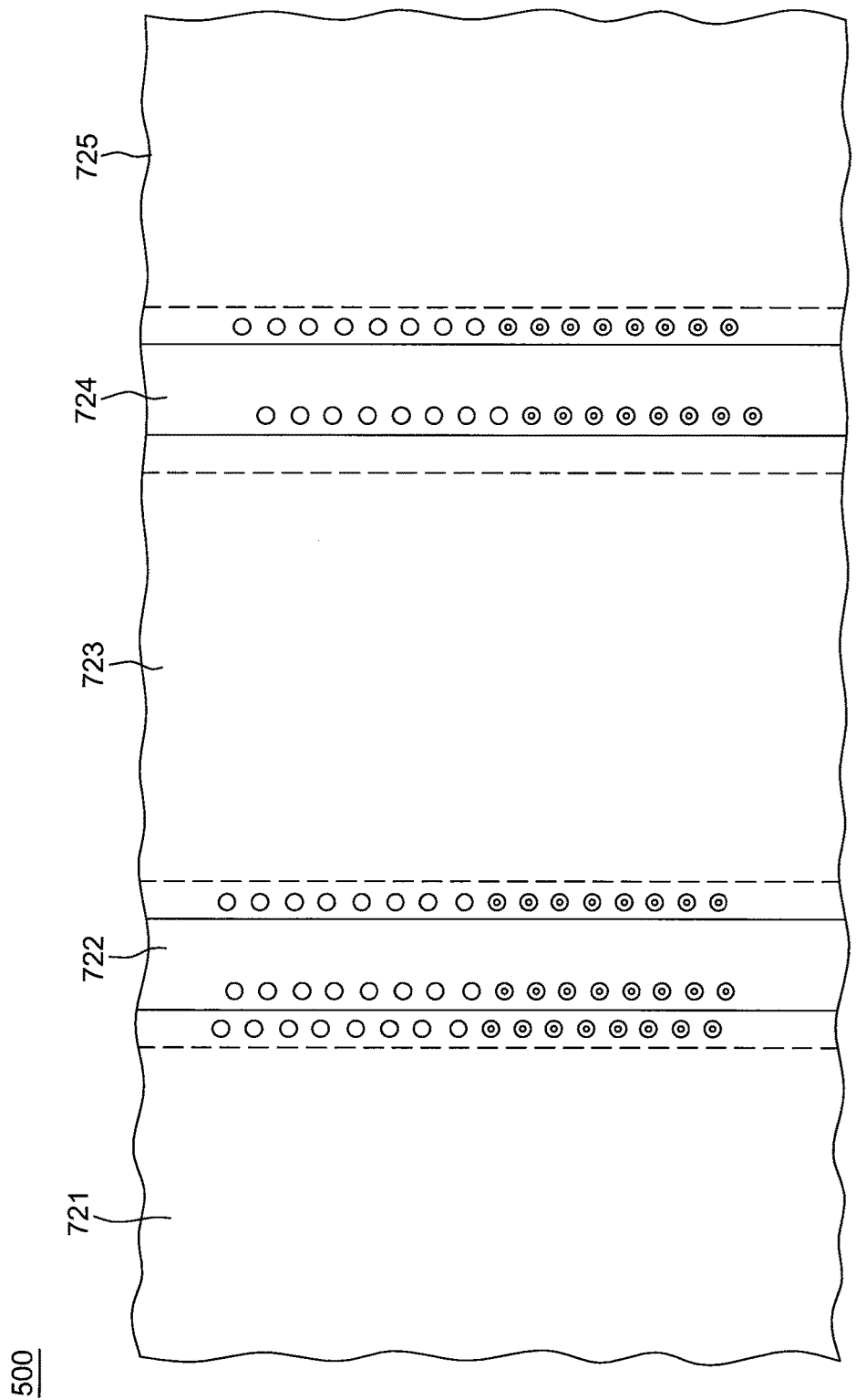
FIG. 8D depicts a tamper-respondent mat layer above the wiring layer of FIG. 8C, and illustrates further offsetting of conductive vias, from one mat layer to the next, to enhance security of the tamper-respondent sensor, in accordance with one or more aspects of the present invention.

FIG. 8D depicts a second tamper-respondent mat layer 500, which in this example, is disposed above tamper-respondent mat layer 500 discussed above in connection with FIGS. 8A & 8B. This second tamper-respondent mat layer 500 is similar to the first except, in the depicted embodiment, the sizes of the tamper-respondent circuit zones 721, 722, 723, 724, 725, are different from the tamper-respondent circuit zones 701, 702, 703, 704, 705, of the tamper-respondent mat layer 500 of FIGS. 8A & 8B. Thus, the boundaries between the tamper-respondent circuit zones between the different layers are offset. This advantageously reduces the opportunity to penetrate both tamper-respondent mat layers along a zone boundary or seam. Depending upon the implementation, electrical contacts to the depicted circuit vias or contacts in the tamper-respondent circuit zones depicted may extend directly upwards into the secure volume. Alternatively, contact vias may be further offset into, for instance, the center lines of tamper-respondent circuit zones 722, 724, in a manner similar to that described above in connection with FIG. 8C. As described above, within each tamper-respondent circuit zone 721-725, a pattern of conductive traces (not shown) is provided. In one or more implementations, tamper-respondent mat layer 500 depicted in FIG. 8D may again comprise any desired number of circuit zones, such as 20, 30, 40, or more, circuit zones, each of which electrically connects within the secure volume in any desired monitor circuitry configuration. Note also that, in one or more embodiments, contacts or vias from the signal layer(s) and/or the lowermost tamper-respondent may layer, may extend through this second tamper-respondent mat layer.

Figure 8E:
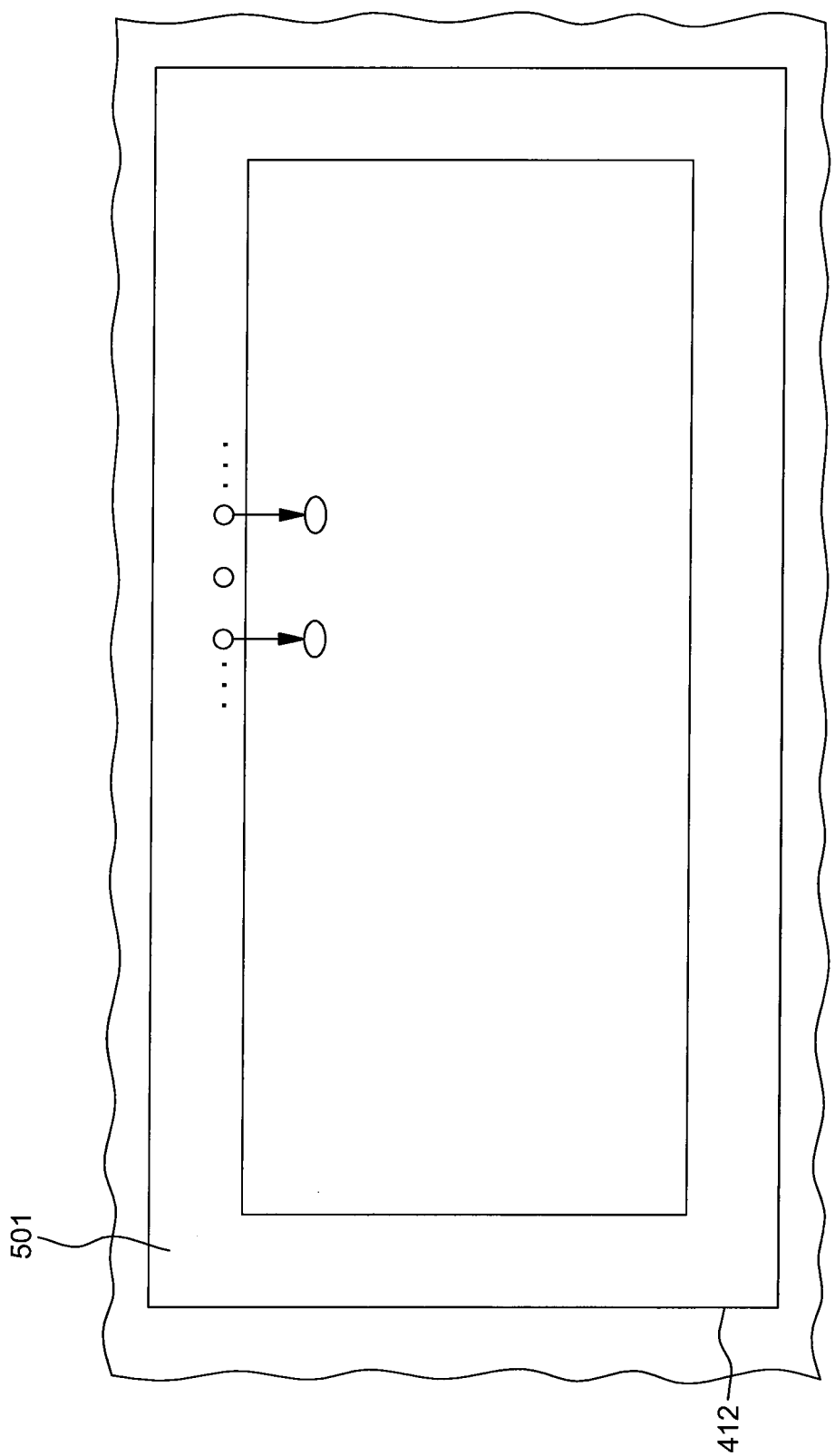
FIG. 8E is a plan view of a first tamper-respondent frame above the tamper-respondent mat layer of FIG. 8D, which facilitates defining, in part, the secure volume within the multilayer circuit board, in accordance with one or more aspects of the present invention.

FIG. 8E depicts an exemplary embodiment of a tamper-respondent frame 501 of a tamper-respondent sensor, in accordance with one or more aspects of the present invention. Tamper-respondent frame 501 resides over the tamper-respondent mat layers 500 described above in connection with FIGS. 8A-8D, and is in one or more embodiments, a picture frame-type layer which completely encircles, and thus serves to define, the secure volume 401 (FIGS. 4A & 5A) within the multilayer circuit board. The tamper-respondent frame illustrated may be a first tamper-respondent frame 501, which provides protective sense wiring or traces, either on the inside or the outside of the enclosure 420 (see FIGS. 4A & 5A), where coupled to the continuous groove or trench within the multilayer circuit board.

Figure 8F:
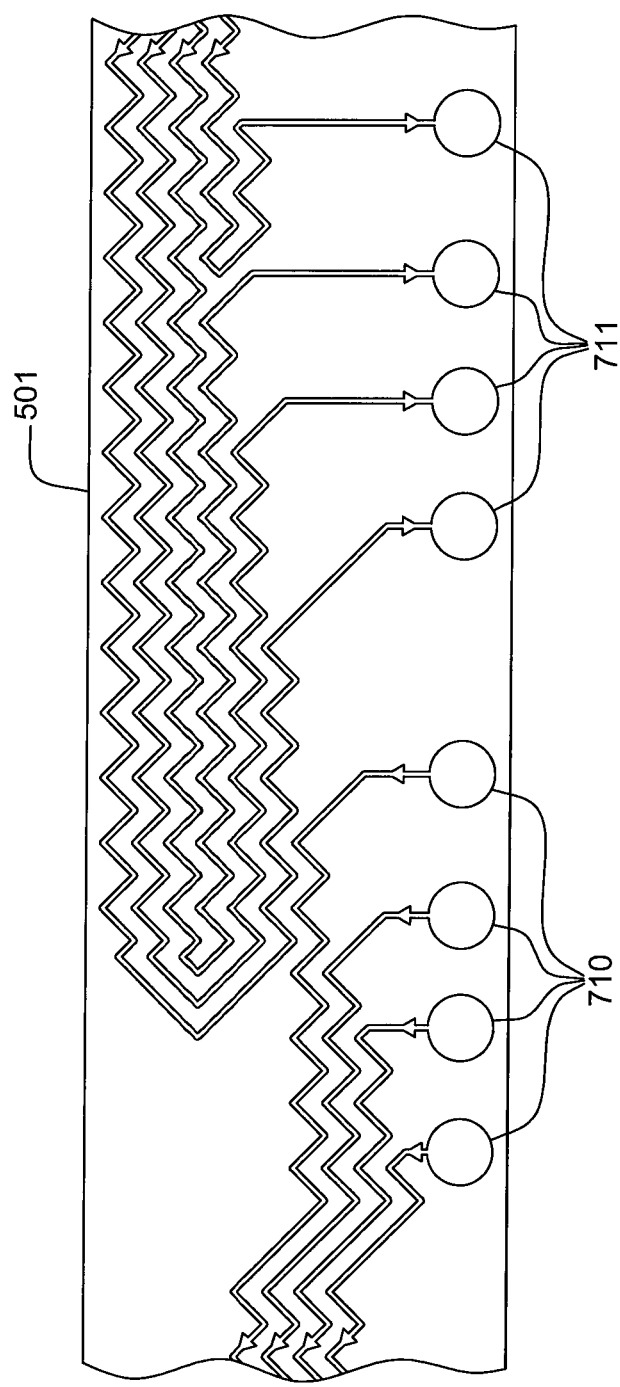
FIG. 8F is a partial depiction of conductive traces for a tamper-respondent frame such as illustrated in FIG. 8E, in accordance with one or more aspects of the present invention.

FIG. 8F depicts an exemplary embodiment of conductive contacts or vias 710, 711 for tamper-respondent frame 501 of FIG. 8E, with four trace lines being depicted, by way of example only. As illustrated, the input contacts 710 and output contacts 711 at the trace terminal points in a particular zone may be disposed in close proximity with the trace lines 801 of tamper-respondent frame 501, and overlap or double back at the seam to minimize possibility of a successful attack through tamper-respondent frame 501 at the seam.

FIG. 8G depicts a second tamper-respondent frame 501, which in one or more embodiments, overlies the first tamper-respondent frame 501 of FIG. 8E (in the example of FIG. 5A), and which may be identical to the first tamper-respondent frame, except rotated 180° so that the wiring contacts 710, 711 are separated from the layer below, as illustrated. As with the tamper-respondent mat layers 500, tamper-respondent frames 501 may be divided into distinct circuit zones to, for instance, further enhance security. For instance, 2, 4, 6, or more, circuit zones may be defined within a particular tamper-respondent frame 501, each with a plurality of conductive traces defined between input contacts 710 and output contacts 711 at the trace terminal points.

Figure 9:
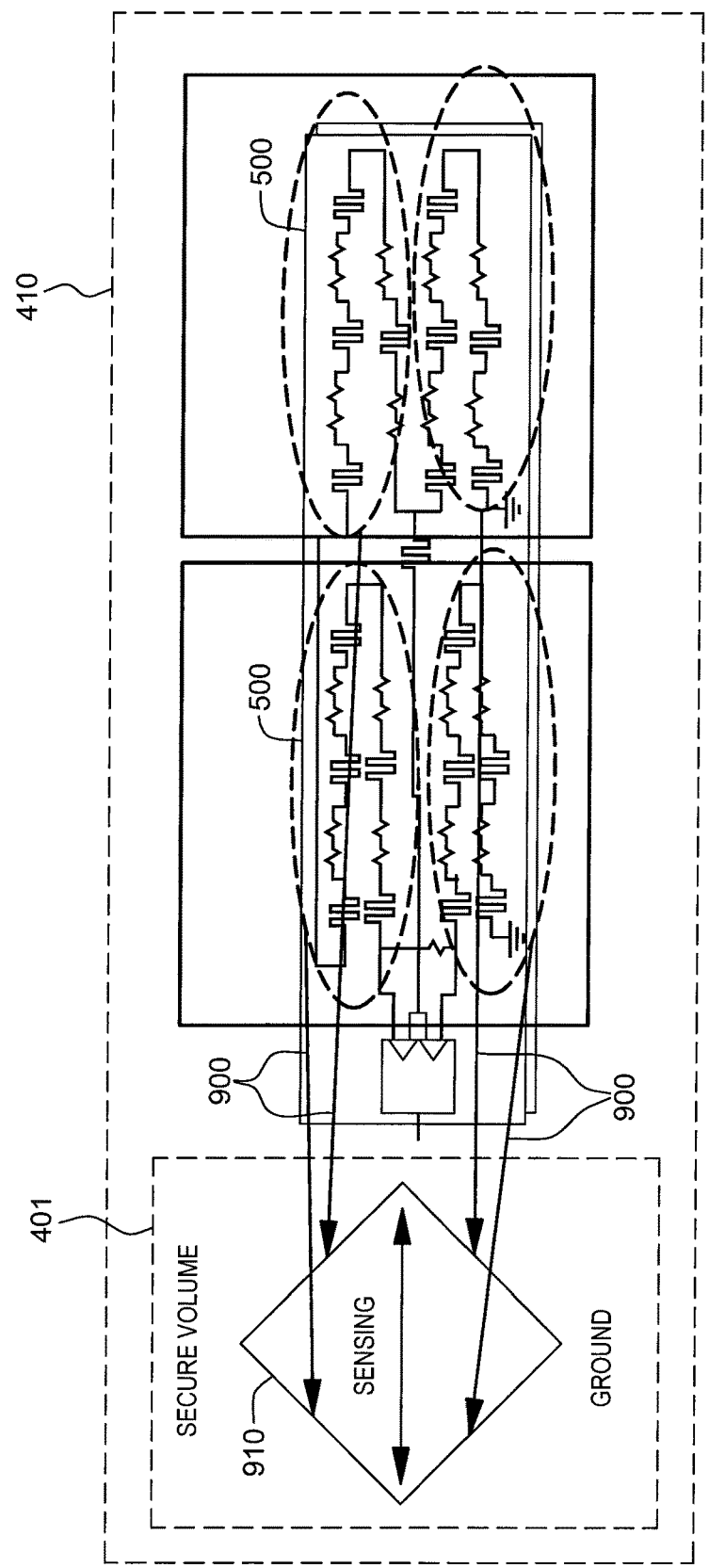
FIG. 9 is a schematic illustration of one embodiment of monitor circuitry and electrical interconnection of different circuit zones of different tamper-respondent layers of the tamper-respondent sensor within the secure volume associated with the multilayer circuit board, in accordance with one or more aspects of the present invention.

The trace lines or circuits within all of the tamper-respondent layers, and in particular, the tamper-respondent circuit zones, of the embedded tamper-respondent sensor are electrically connected into monitor or compare circuitry 900 provided, for instance, within secure volume 401 of multilayer circuit board 410, as illustrated in FIG. 9. Monitor circuitry 900 may include various bridge or compare circuits, and conventional printed wiring board electrical interconnect inside the secure volume 401, for instance, located within the secure volume defined by the tamper-respondent frames 501 (FIG. 5A), and the tamper-respondent mat layers.

Note that advantageously, different tamper-respondent circuit zones on different tamper-respondent layers may be electrically interconnected into, for instance, the same comparator circuit or Wheatstone bridge of the monitor circuitry. Thus, any of a large number of interconnect configurations may be possible. For instance, if each tamper-respondent mat layer contains 30 tamper-respondent circuit zones, and each tamper-respondent frame contains four tamper-respondent circuit zones, then, for instance, the resultant sixty-eight tamper-respondent circuit zones may be connected in any configuration within the secure volume to create the desired arrangement of circuit networks within the secure volume being monitored for changes in resistance or tampering. Note in this regard, that the power supply or battery for the tamper-respondent sensor may be located external to the secure volume, with the sensor being configured to trip and destroy any protected or critical data if the power supply or battery is tampered with.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating an electronic circuit comprising:
   providing a multilayer circuit board, the multilayer circuit board being a single circuit board formed of multiple layers; and
   disposing at least one electronic component on an uppermost surface of the multilayer circuit board, the multilayer circuit board including a continuous groove formed in the uppermost surface of the multilayered circuit board to facilitate attaching an enclosure to the multilayer circuit board, the at least one electronic component being within a surface area of the uppermost surface encircled by the continuous groove;
   providing a tamper-respondent sensor embedded within the multilayer circuit board, the tamper-respondent sensor defining, at least in part, a secure volume associated with the multilayer circuit board, and comprising:

multiple tamper-respondent layers within the multilayer circuit board, the multiple tamper-respondent layers being spaced apart, parallel layers within the multilayer circuit board that facilitate defining the secure volume, at least in part, within the multilayer circuit board, and the multiple tamper-respondent layers comprising:

at least one tamper-respondent picture frame-type layer encircling the secure volume within the multilayer circuit board and disposed below the surface area of the multilayer circuit board encircled by the continuous groove, a tamper-respondent picture frame-type layer of the at least one tamper-respondent picture frame-type layer comprising one or more conductive trace lines extending horizontally around the tamper-respondent picture frame-type layer within the multilayer circuit board and encircling the secure volume within the multilayer circuit board; and at least one tamper-respondent mat layer forming a base of the secure volume within the multilayer circuit board, the at least one tamper-respondent frame layer being disposed over the at least one tamper-respondent mat layer.

2. The method of claim 1, wherein at least one tamper-respondent layer of the multiple tamper-respondent layers comprises multiple, separate tamper-respondent circuit zones, and wherein the multiple tamper-respondent layers, including the multiple, separate tamper-respondent circuit zones of the at least one tamper-respondent layer, are electrically connected to monitor circuitry within the secure volume associated with the multilayer circuit board.

3. The method of claim 1, wherein at least two tamper-respondent layers of the multiple tamper-respondent layers each comprise multiple, separate tamper-respondent circuit zones, and wherein at least two tamper-respondent circuit zones within different tamper-respondent layers of the at least two tamper-respondent layers are electrically connected to a common monitor circuit within the secure volume associated with the multilayer circuit board.

4. The method of claim 3, wherein the at least one tamper-respondent picture frame-type layer of the multiple tamper-respondent layers defines, at least in part, a side portion of the secure volume within the multilayer circuit board.

5. The method of claim 1, wherein the multilayer circuit board comprises an external signal layer embedded within the multilayer circuit board, the external signal layer electrically connecting to the at least one electronic component disposed on the multilayer circuit board within the secure volume, and residing, at least in part, over a tamper-respondent mat layer of the at least one tamper-respondent mat layer.

6. The method of claim 1, wherein the multiple tamper-respondent layers within the multilayer circuit board comprise at least two tamper-respondent picture frame-type layers, the at least two tamper-respondent picture frame-type layers defining, at least in part, a periphery of the secure volume where extending into the multilayer circuit board.

7. The method of claim 1, wherein the at least one tamper-respondent picture frame-type layer embedded within the multilayer circuit board defines a periphery of the secure volume within the multilayer circuit board.

8. The method of claim 1, wherein the one or more conductive trace lines of the tamper-respondent picture frame-type layer of the at least one tamper-respondent picture frame-type layer encircling the secure volume within the multilayer circuit board are encircled or intersected by the continuous groove in the uppermost surface of the multilayer circuit board.

9. The method of claim 8, wherein the tamper-respondent mat layer of the at least one tamper-respondent may layer extends from below the secure volume outward past the groove in the multilayer circuit board.

\* \* \* \* \*